(12) United States Patent
Hoffman et al.

(10) Patent No.: US 6,894,245 B2
(45) Date of Patent: May 17, 2005

(54) MERIE PLASMA REACTOR WITH OVERHEAD RF ELECTRODE TUNED TO THE PLASMA WITH ARCING SUPPRESSION

(75) Inventors: Daniel J. Hoffman, Saratoga, CA (US); Yan Ye, Saratoga, CA (US); Dan Katz, Agoura Hills, CA (US); Douglas A. Buchberger, Jr., Livermore, CA (US); Xiaoye Zhao, Mountain View, CA (US); Kang-Lie Chiang, San Jose, CA (US); Robert B. Hagen, Newark, CA (US); Matthew L. Miller, Newark, CA (US)

(73) Assignee: Applied Materials, Inc., Santa Clara, CA (US)

( * ) Notice: Subject to any disclaimer, the term of this patent is extended or adjusted under 35 U.S.C. 154(b) by 484 days.

(21) Appl. No.: 10/007,367

(22) Filed: Oct. 22, 2001

(65) Prior Publication Data
US 2004/0211759 A1 Oct. 28, 2004

Related U.S. Application Data

(63) Continuation-in-part of application No. 09/527,342, filed on Mar. 17, 2000.

(51) Int. Cl.[7] .............................................. B23K 10/00
(52) U.S. Cl. .............................. 219/121.43; 219/121.4; 156/345.44; 156/345.34; 315/111.21; 118/723 I
(58) Field of Search ........................ 219/121.4, 121.43, 219/121.52, 121.57, 121.59, 121.49; 118/723 RF; 156/345.34, 345.44, 345.47, 345.49, 345.42; 315/111.51, 111.21

(56) References Cited

U.S. PATENT DOCUMENTS

| | | | |
|---|---|---|---|
| 4,464,223 A | 8/1984 | Gorin | 156/643 |
| 4,579,618 A | 4/1986 | Celestino | 156/345 |
| 4,859,908 A | 8/1989 | Yoshida et al. | 315/111.81 |
| 4,973,883 A | 11/1990 | Hirose et al. | 315/111.41 |
| 4,990,229 A | 2/1991 | Campbell et al. | 204/298.06 |
| 5,006,760 A | 4/1991 | Drake, Jr. | 315/111.21 |

(Continued)

FOREIGN PATENT DOCUMENTS

| | | |
|---|---|---|
| EP | 0 343 500 A1 | 11/1989 |
| EP | 0 678 903 A | 10/1995 |
| EP | 0 678 903 A1 | 10/1996 |
| EP | 0 719 447 B1 | 7/1998 |
| WO | WO 01/71765 A2 | 9/2001 |

OTHER PUBLICATIONS

King, Ronald W.P., "Transmission–line Theory", McGraw–Hill Book Company, pp. 1–10 and 282–286, USA.

Primary Examiner—Mark Paschall
(74) Attorney, Agent, or Firm—Robert M. Wallace; Joseph Bach

(57) ABSTRACT

A plasma reactor for processing a semiconductor workpiece, includes a reactor chamber having a chamber wall and containing a workpiece support for holding the semiconductor support, the electrode comprising a portion of the chamber wall, an RF power generator for supplying power at a frequency of the generator to the overhead electrode and capable of maintaining a plasma within the chamber at a desired plasma ion density level. The overhead electrode has a capacitance such that the overhead electrode and the plasma formed in the chamber at the desired plasma ion density resonate together at an electrode-plasma resonant frequency, the frequency of the generator being at least near the electrode-plasma resonant frequency. The reactor further includes a set of MERIE magnets surrounding the plasma process area overlying the wafer surface that produce a slowly circulating magnetic field which stirs the plasma to improve plasma ion density distribution uniformity.

31 Claims, 10 Drawing Sheets

U.S. PATENT DOCUMENTS

| | | | |
|---|---|---|---|
| 5,017,835 A | 5/1991 | Oechsner | 315/111.81 |
| 5,032,202 A | 7/1991 | Tsai et al. | 156/345 |
| 5,055,853 A | 10/1991 | Garnier | 343/769 |
| 5,077,499 A | 12/1991 | Oku | 315/111.21 |
| 5,089,083 A | 2/1992 | Kojima et al. | 156/643 |
| 5,107,170 A | 4/1992 | Ishikawa et al. | 313/362.1 |
| 5,115,167 A | 5/1992 | Ootera et al. | 315/111.21 |
| 5,122,251 A | 6/1992 | Campbell et al. | 204/298.06 |
| 5,140,223 A | 8/1992 | Gesche et al. | 315/111.21 |
| 5,175,472 A | 12/1992 | Johnson, Jr. et al. | 315/111.21 |
| 5,195,045 A | 3/1993 | Keane et al. | 364/482 |
| 5,198,725 A | 3/1993 | Chen et al. | 315/111.41 |
| 5,210,466 A | 5/1993 | Collins et al. | 315/111.21 |
| 5,213,658 A | 5/1993 | Ishida | 156/643 |
| 5,223,457 A | 6/1993 | Mintz et al. | 437/225 |
| 5,225,024 A | 7/1993 | Hanley et al. | 156/345 |
| 5,246,532 A | 9/1993 | Ishida | 156/345 |
| 5,272,417 A | 12/1993 | Ohmi | 315/111.21 |
| 5,273,610 A | 12/1993 | Thomas, III et al. | 156/627 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,312,778 A | 5/1994 | Collins et al. | 437/225 |
| 5,325,019 A | 6/1994 | Miller et al. | 315/111.21 |
| 5,401,351 A | 3/1995 | Samukawa | 156/345 |
| 5,453,305 A | 9/1995 | Lee | 427/562 |
| 5,463,525 A | 10/1995 | Barnes et al. | 3361/234 |
| 5,467,013 A | 11/1995 | Williams et al. | 324/127 |
| 5,474,648 A | 12/1995 | Patrick et al. | 156/627.1 |
| 5,512,130 A | 4/1996 | Barna et al. | 156/651.1 |
| 5,534,070 A | 7/1996 | Okamura et al. | 118/723 |
| 5,537,004 A | 7/1996 | Imahashi et al. | 315/111.21 |
| 5,554,223 A | 9/1996 | Imahashi | 118/723 |
| 5,556,549 A | 9/1996 | Patrick et al. | 216/61 |
| 5,567,268 A | 10/1996 | Kadomura | 156/345 |
| 5,576,629 A | 11/1996 | Turner et al. | 324/709 |
| 5,587,038 A | 12/1996 | Cecchi et al. | 156/345 |
| 5,592,055 A | 1/1997 | Capacci et al. | 315/111.21 |
| 5,595,627 A | 1/1997 | Inazawa et al. | 156/643.1 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,660,671 A | 8/1997 | Harada et al. | 156/345 |
| 5,662,770 A | 9/1997 | Donohoe | 438/716 |
| 5,674,321 A | 10/1997 | Pu et al. | 118/723 |
| 5,685,914 A | 11/1997 | Hills et al. | 118/723 |
| 5,705,019 A | 1/1998 | Yamada et al. | 156/345 |
| 5,707,486 A | 1/1998 | Collins | 156/643.1 |
| 5,710,486 A | 1/1998 | Ye et al. | 315/111.21 |
| 5,720,826 A | 2/1998 | Hayashi et al. | 136/249 |
| 5,733,511 A | 3/1998 | De Francesco | 422/186.05 |
| 5,770,922 A | 6/1998 | Gerrish et al. | 315/111.21 |
| 5,773,511 A | 6/1998 | Marutani et al. | 422/186.05 |
| 5,792,376 A | 8/1998 | Kanai et al. | 216/71 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,858,819 A | 1/1999 | Miyasaka | 438/149 |
| 5,863,376 A | 1/1999 | Wicker et al. | 156/345 |
| 5,904,799 A | 5/1999 | Donohoe | 156/345 |
| 5,914,568 A | 6/1999 | Nonaka | 315/111.21 |
| 5,929,717 A | 7/1999 | Richardson et al. | 333/17.3 |
| 5,936,481 A | 8/1999 | Fuji | 333/17.3 |
| 5,939,886 A | 8/1999 | Turner et al. | 324/464 |
| 5,971,591 A | 10/1999 | Vona et al. | 364/478.08 |
| 5,997,962 A | 12/1999 | Ogasawara et al. | 427/535 |
| 6,016,131 A | 1/2000 | Sato et al. | 343/895 |
| 6,043,608 A | 3/2000 | Samukawa et al. | 315/111.51 |
| 6,093,457 A | 7/2000 | Okumura et al. | 427/569 |
| 6,096,160 A | 8/2000 | Kadomura | 156/345 |
| 6,110,395 A | 8/2000 | Gibson, Jr. | 216/67 |
| 6,113,731 A | 9/2000 | Shan et al. | 156/345 |
| 6,142,096 A | 11/2000 | Sakai et al. | 118/723 |
| 6,152,071 A | 11/2000 | Akiyama et al. | 118/723 |
| 6,155,200 A | 12/2000 | Horiike et al. | 118/723 |
| 6,162,709 A | 12/2000 | Raoux et al. | 438/513 |
| 6,174,450 B1 | 1/2001 | Patrick et al. | 216/61 |
| 6,188,564 B1 | 2/2001 | Hao | 361/234 |
| 6,213,050 B1 | 4/2001 | Liu et al. | 118/723 |
| 6,218,312 B1 | 4/2001 | Collins et al. | 438/723 |
| 6,245,190 B1 | 6/2001 | Masuda et al. | 156/345 |
| 6,251,216 B1 | 6/2001 | Okamura et al. | 156/345 |
| 6,262,538 B1 | 7/2001 | Keller | 315/111.21 |
| 6,290,806 B1 | 9/2001 | Donohoe | 156/345 |
| 6,291,999 B1 | 9/2001 | Nishimori et al. | 324/464 |
| 6,337,292 B1 | 1/2002 | Kim et al. | 438/787 |
| 6,346,915 B1 | 2/2002 | Okumura et al. | 343/701 |
| RE37,580 E | 3/2002 | Barnes et al. | 361/234 |
| 6,449,568 B1 | 9/2002 | Gerrish | 702/60 |
| 6,451,703 B1 | 9/2002 | Liu et al. | 438/710 |
| 6,462,481 B1 | 10/2002 | Holland et al. | 315/111.21 |
| 6,528,751 B1 | 3/2003 | Hoffman et al. | 219/121.43 |

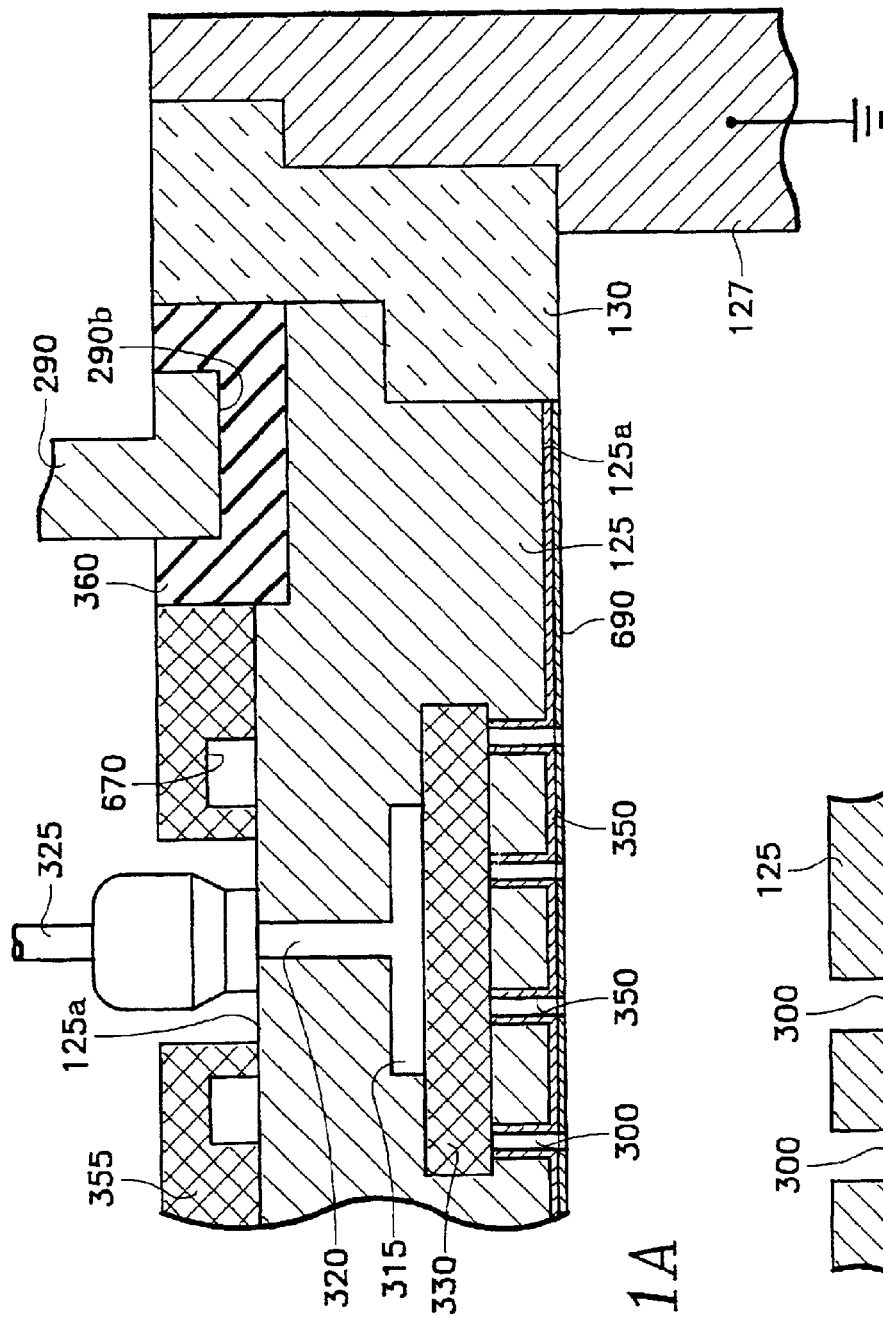
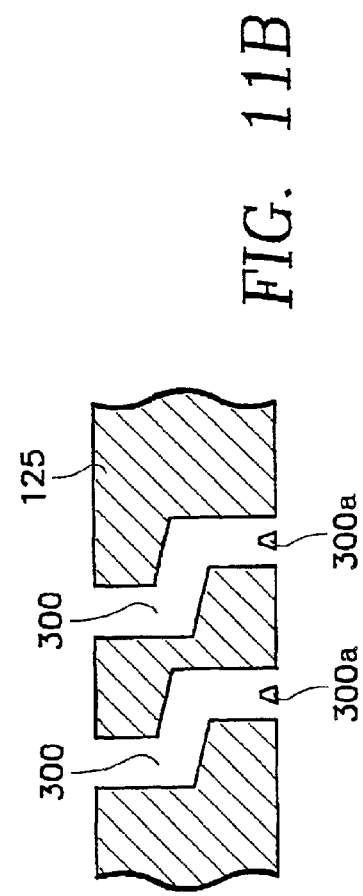
FIG. 11A
FIG. 11B

US 6,894,245 B2

MERIE PLASMA REACTOR WITH OVERHEAD RF ELECTRODE TUNED TO THE PLASMA WITH ARCING SUPPRESSION

CROSS-REFERENCE TO RELATED APPLICATIONS

This application is a continuation in part of U.S. application Ser. No. 09/527,342 filed Mar. 17, 2000 by Daniel Hoffman et al., entitled "Plasma Reactor with Overhead RF Electrode Tuned to the Plasma" and assigned to the present assignee.

BACKGROUND OF THE INVENTION

An RF plasma reactor is used to process semiconductor wafers to produce microelectronic circuits. The reactor forms a plasma within a chamber containing the wafer to be processed. The plasma is formed and maintained by application of RF plasma source power coupled either inductively or capacitively into the chamber. For capacitive coupling of RF source power into the chamber, an overhead electrode (facing the wafer) is powered by an RF source power generator.

One problem in such reactors is that the output impedance of the RF generator, typically 50 Ohms, must be matched to the load impedance presented by the combination of the electrode and the plasma. Otherwise the amount of RF power delivered to the plasma chamber will fluctuate with fluctuations in the plasma load impedance so that certain process parameters such as plasma density cannot be held within the required limits.
The plasma load impedance fluctuates during processing because it depends upon conditions inside the reactor chamber which tend to change dynamically as processing progresses. At an optimum plasma density for dielectric or conductor etch processes, the load impedance is very small compared to the output impedance of the RF generator and can vary significantly during the processing of the wafer. Accordingly, an impedance match circuit must be employed to actively maintain an impedance match between the generator and the load. Such active impedance matching uses either a variable reactance and/or a variable frequency. One problem with such impedance match circuits is that they must be sufficiently agile to follow rapid changes in the plasma load impedance, and therefore are relatively expensive and can reduce system reliability due to their complexity.

Another problem is that the range of load impedances over which the match circuit can provide an impedance match (the "match space") is limited. The match space is related to the system Q, where Q=Δf/f, f being a resonant frequency of the system and Δf being the bandwidth on either side of f within which resonant amplitude is within 6 dB of the peak resonant amplitude at f. The typical RF generator has a limited ability to maintain the forward power at a nearly constant level even as more RF power is reflected back to the generator as the plasma impedance fluctuates. Typically, this is achieved by the generator servoing its forward power level, so that as an impedance mismatch increases (and therefore reflected power increases), the generator increases its forward power level. Of course, this ability is limited by the maximum forward power which the generator is capable of producing. Typically, the generator is capable of handling a maximum ratio of forward standing wave voltage to reflected wave voltage (i.e., the voltage standing wave ratio or VSWR) of not more than 3:1. If the difference in impedances increases (e.g., due to plasma impedance fluctuations during processing) so that the VSWR exceeds 3:1, then the RF generator can no longer control the delivered power, and control over the plasma is lost. As a result, the process is likely to fail. Therefore, at least an approximate impedance match must be maintained between the RF generator and the load presented to it by the combination of the electrode and the chamber. This approximate impedance match must be sufficient to keep the VSWR at the generator output within the 3:1 VSWR limit over the entire anticipated range of plasma impedance fluctuations. The impedance match space is, typically, the range of load impedances for which the match circuit can maintain the VSWR at the generator output at or below 3:1.

A related problem is that the load impedance itself is highly sensitive to process parameters such as chamber pressure, plasma source power level, source power frequency and plasma density. This limits the range of such process parameters (the "process window") within which the plasma reactor must be operated to avoid an unacceptable impedance mismatch or avoid fluctuations that take load impedance outside of the match space. Likewise, it is difficult to provide a reactor which can be operated outside of a relatively narrow process window and process use, or one that can handle many process applications.

Another related problem Is that the load impedance is also affected by the configuration of the reactor itself, such as dimensions of certain mechanical features and the conductivity or dielectric constant of certain materials within the reactor. (Such configurational items affect reactor electrical characteristics, such as stray capacitance for example, that in turn affect the load impedance.) This makes it difficult to maintain uniformity among different reactors of the same design due to manufacturing Tolerances and variations in materials. As a result, with a high system Q and correspondingly small impedance match space, it is difficult to produce any two reactors of the same design which exhibit the same process window or provide the same performance.

Another problem is inefficient use of the RF power source. Plasma reactors are known to be inefficient, in that the amount of power delivered to the plasma tends to be significantly less than the power produced by the RF generator. As a result, an additional cost in generator capability and a trade-off against reliability must be incurred to produce power in excess of what is actually required to be delivered into the plasma.

SUMMARY OF THE INVENTION

A plasma reactor for processing a semiconductor workpiece, includes a reactor chamber having a chamber wall and containing a workpiece support for holding the semiconductor workpiece, an overhead electrode overlying said workpiece support, the electrode comprising a portion of the chamber wall, an RF power generator for supplying power at a frequency of the generator to the overhead electrode and capable of maintaining a plasma within the chamber at a desired plasma ion density level. The overhead electrode has a capacitance such that the overhead electrode and the plasma formed in the chamber at the desired plasma ion density resonate together at an electrode-plasma resonant frequency, the frequency of the generator being at least near the electrode-plasma resonant frequency. The reactor further includes a set of MERIE magnets surrounding the plasma process area overlying the wafer surface that produce a slowly circulating magnetic field which stirs the plasma to improve plasma ion density distribution uniformity. The reactor can include an insulating layer formed on a surface of the overhead electrode facing the workpiece support, a capacitive insulating layer between the RF power generator and the overhead electrode, and a metal or ceramic foam layer overlying and contacting a surface of the overhead electrode that faces away from the workpiece support. The insulating layer provides a capacitance sufficient to suppress arcing within the gas injection ports, the capacitive insulating layer has a sufficient capacitance to block D.C. current from a plasma within the chamber from flowing through the overhead electrode, and the metal foam layer is of a sufficient thickness to suppress an axial electric field within the gas injection orifices.

BRIEF DESCRIPTION OF THE DRAWINGS

FIG. 11A is another enlarged view of FIG. 8.

FIG. 11B depicts an alternative embodiment corresponding to FIG. 11A.

DETAILED DESCRIPTION

Figure 1:
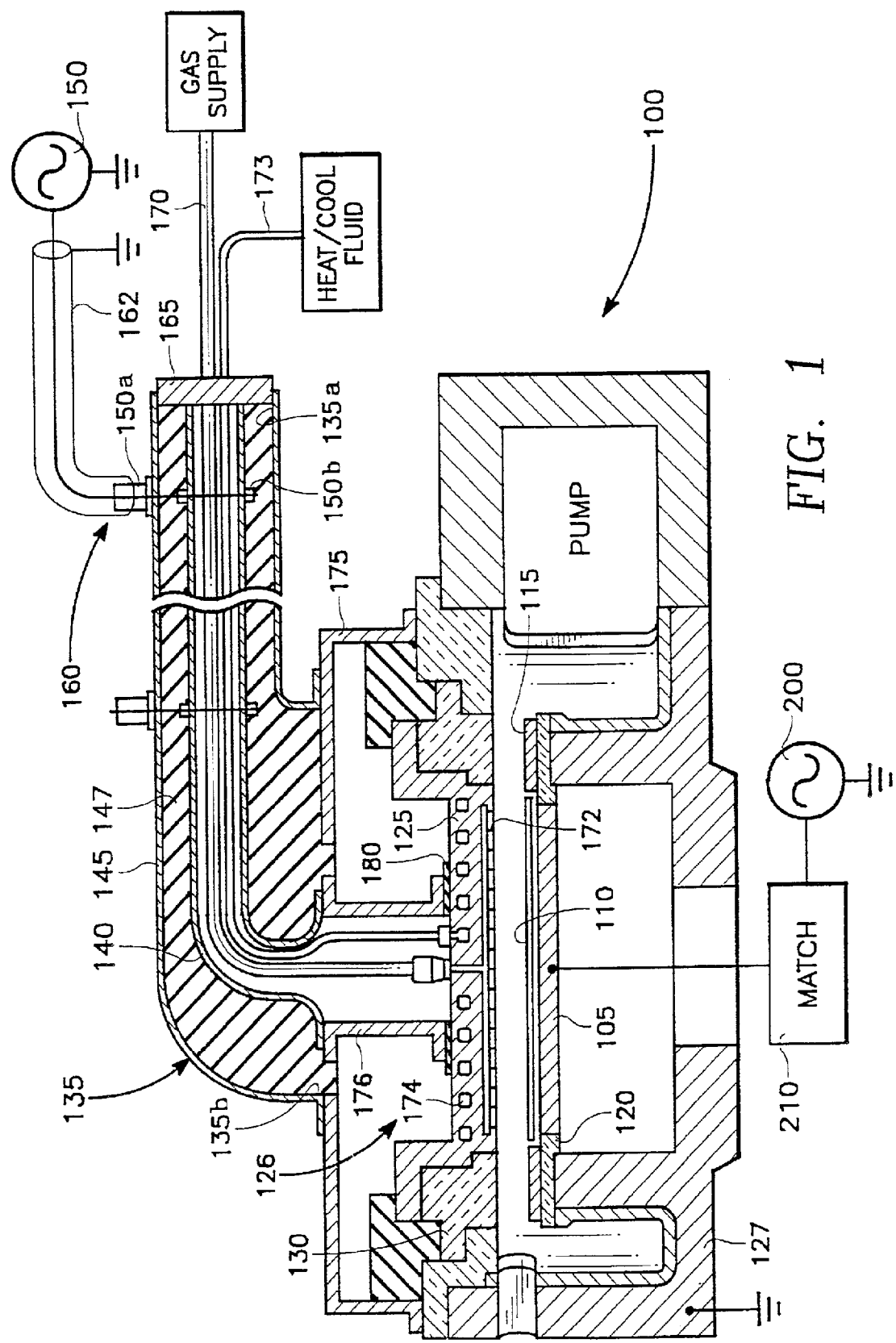
FIG. 1 is a cut-away cross-sectional side view of a plasma reactor according to an embodiment of the invention.

Referring to FIG. 1, a plasma reactor includes a reactor chamber 100 with a wafer support 105 at the bottom of the chamber supporting a semiconductor wafer 110. A process kit may include, in an examplary implementation, a conductive or semi-conductive ring 115 supported by a dielectric ring 120 on a grounded chamber body 127. The chamber 100 is bounded at the top by a disc shaped overhead conductive electrode supported at a predetermined gap length above the wafer 110 on grounded chamber body 127 by a dielectric seal. The overhead electrode 125 may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the coaxial cable 162 or the output of the RF power generator 150, as will be more fully described below. The chamber body is connected to the RF return (RF ground) of the RF generator 150. The RF path from the overhead electrode 125 to RF ground is affected by the capacitance of the dielectric seal 120 and by the capacitance of the dielectric seal 130. The wafer support 105, the wafer 110 and the process kit conductive or semiconductive ring 115 provide the primary RF return path for RF power applied to the electrode 125.

The capacitance of the overhead electrode assembly 126, including the electrode 125, the process kit 115, 120 and the dielectric seal 130 measured with respect to RF return or ground is, in an exemplary embodiment, 180 pico farads. The electrode assembly capacitance is affected by the electrode area, the gap length (distance between wafer support and overhead electrode), and by factors affecting stray capacitances, especially the dielectric values of the seal 130 and of the dielectric ring 120, which in turn are affected by the dielectric constants and thicknesses of the materials employed. More generally, the capacitance of the electrode assembly 126 (an unsigned number or scalar) is equal or nearly equal in magnitude to the negative capacitance of the plasma (a complex number) at a particular source power frequency, plasma density and operating pressure, as will be discussed below.

Many of the factors influencing the foregoing relationship are in great part predetermined due to the realities of the plasma process requirements needed to be performed by the reactor, the size of the wafer, and the requirement that the processing be carried out uniformly over the wafer. Thus, the plasma capacitance is a function of the plasma density and the source power frequency, while the electrode capacitance is a function of the wafer support-to-electrode gap (height), electrode diameter, and dielectric values of the insulators of the assembly. Plasma density, operating pressure, gap, and electrode diameter must satisfy the requirements of the plasma process to be performed by the reactor. In particular, the ion density must be within a certain range. For example, silicon and dielectric plasma etch processes generally require the plasma ion density to be within the range of $10^9$–$10^{12}$ ions/cc. The wafer electrode gap provides an optimum plasma ion distribution uniformity for 8 inch wafers, for example, if the gap is about 2 inches. The electrode diameter is preferably at least as great as, if not greater than the diameter of the wafer. Operating pressures similarly have practical ranges for typical etch and other plasma processes.

But it has been found that other factors remain which can be selected to achieve the above preferred relationship, particularly choice of source frequency and choice of capacitances for the overhead electrode assembly 126. Within the foregoing dimensional constraints imposed on the electrode and the constraints (e.g., density range) imposed on the plasma, the electrode capacitance can be matched to the magnitude of the negative capacitance of the plasma if the source power frequency is selected to be a VHF frequency, and if the dielectric values of the insulator components of electrode assembly 126 are selected properly. Such selection can achieve a match or near match between source power frequency and plasma-electrode resonance frequency.

Accordingly in one exemplary embodiment, for an 8-inch wafer the overhead electrode diameter is approximately 11 inches, the gap is about 2 inches, the plasma density and operating pressure is typical for etch processes as above-stated, the VHF source power frequency is 210 MHz (although other VHF frequencies could be equally effective), and the source power frequency, the plasma electrode resonance frequency and the stub resonance frequency are all matched or nearly matched.

More particularly, these three frequencies are slightly offset from one another, with the source power frequency being 210 MHz, the electrode-plasma resonant frequency being approximately 200 MHz, and the stub frequency being about 220 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

The coaxial stub 135 is a specially configured design which further contributes to the overall system stability, its wide process window capabilities, as well as many other valuable advantages. It includes an inner cylindrical conductor 140 and an outer concentric cylindrical conductor 145. An insulator 147 (denoted by cross-hatching in FIG. 1) for example having a relative dielectric constant of 1 fills the space between the inner and outer conductors 140, 145. The inner and outer conductors 140, 145 may be formed, for example, of nickel-coated aluminum. In an exemplary embodiment, the outer conductor 145 has a diameter of about 4 inches and the inner conductor 140 has a diameter of about 1.5 inches. The stub characteristic impedance is determined by the radii of the inner and outer conductors 140, 145 and the dielectric constant of the insulator 147. The stub 135 of the embodiment described above has a characteristic impedance of 65 Ω. More generally, the stub characteristic impedance exceeds the source power output impedance by about 20%–40% and preferably by about 30%. The stub 135 has an axial length of about 29 inches—a quarter wavelength at 220 MHz—in order to have a resonance in the vicinity of 220 MHz to generally match while being slightly offset from the VHF source power frequency of 210 MHz.

A tap 160 is provided at a particular point along the axial length of the stub 135 for applying RF power from the RF generator 150 to the stub 135, as will be discussed below. The RF power terminal 150b and the RF return terminal 150a of the generator 150 are connected at the tap 160 on the stub 135 to the inner and outer coaxial stub conductors 140, 145, respectively. These connections are made via a generator-to-stub coaxial cable 162 having a characteristic impedance that matches the output impedance of the generator 150 (typically, 50 Ω) in the well-known manner. A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 provides a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 while the metallic coolant line 173 feeds coolant passages or jackets 174 within the overhead electrode 125.

An active and resonant impedance transformation is thereby provided by this specially configured stub match between the RF generator 150, and the overhead electrode assembly 126 and processing plasma load, minimizing reflected power and providing a very wide impedance match space accommodating wide changes in load impedance. Consequently, wide process windows and process flexibility is provided, along with previously unobtainable efficiency in use of power, all while minimizing or avoiding the need for typical impedance match apparatus. As noted above, the stub resonance frequency is also offset from ideal match to further enhance overall system Q, system stability and process windows and multi-process capability.

Matching the Electrode-Plasma Resonance Frequency and the VHF Source Power Frequency:

As outlined above, a principal feature is to configure the overhead electrode assembly 126 for resonance with the plasma at the electrode-plasma resonant frequency and for the matching (or the near match of) the source power frequency and the electrode-plasma frequency. The electrode assembly 126 has a predominantly capacitive reactance while the plasma reactance is a complex function of frequency, plasma density and other parameters. (As will be described below in greater detail, a plasma is analyzed in terms of a reactance which is a complex function involving imaginary terms and generally corresponds to a negative capacitance.) The electrode-plasma resonant frequency is determined by the reactances of the electrode assembly 126 and of the plasma (in analogy with the resonant frequency of a capacitor/inductor resonant circuit being determined by the reactances of the capacitor and the inductor). Thus the electrode-plasma resonant frequency may not necessarily be the source power frequency, depending as it does upon the plasma density. The problem, therefore, is to find a source power frequency at which the plasma reactance is such that the electrode-plasma resonant frequency is equal or nearly equal to the source power frequency, given the constraints of practical confinement to a particular range of plasma density and electrode dimensions. The problem is even more difficult, because the plasma density (which affects the plasma reactance) and the electrode dimensions (which affect electrode capacitance) must meet certain process constraints. Specifically, for dielectric and conductor plasma etch processes, the plasma density should be within the range of $10^9$–$10^{12}$ ions/cc, which is a constraint on the plasma reactance. Moreover, a more uniform plasma ion density distribution for processing 8-inch diameter wafers for example, is realized by a wafer-to-electrode gap or height of about 2 inches and an electrode diameter on the order of the wafer diameter, or greater, which is a constraint on the electrode capacitance. On the other hand, a different gap may be utilized for a 12-inch diameter wafer.

Accordingly, by matching (or nearly matching) the electrode capacitance to the magnitude of the negative capacitance of the plasma, the electrode-plasma resonant frequency and the source power frequency are at least nearly matched. For the general conductor and dielectric etch process conditions enumerated above (i.e., plasma density between $10^9$–$10^{12}$ ions/cc, a 2-inch gap and an electrode diameter on the order of roughly 11 inches), the match is possible if the source power frequency is a VHF frequency. Other conditions (e.g., different wafer diameters, different plasma densities, etc.) may dictate a different frequency range to realize such a match in carrying out this feature of the reactor. As will be detailed below, under favored plasma processing conditions for processing 8-inch wafers in several principal applications including dielectric and metal plasma etching and chemical vapor deposition, the plasma capacitance in one typical working example having plasma densities as set forth above was between −50 and −400 pico farads. In an exemplary embodiment the capacitance of the overhead electrode assembly 126 was matched to the magnitude of this negative plasma capacitance by using an electrode diameter of 11 inches, a gap length (electrode to pedestal spacing) of approximately 2 inches, choosing a dielectric material for seal 130 having a dielectric constant of 9, and a thickness of the order of one inch, and a dielectric material for the ring 120 having a dielectric constant of 4 and thickness of the order of 10 mm.

The combination of electrode assembly 126 and the plasma resonates at an electrode-plasma resonant frequency that at least nearly matches the source power frequency applied to the electrode 125, assuming a matching of their capacitances as just described. We have discovered that for favored etch plasma processing recipes, environments and plasmas, this electrode-plasma resonant frequency and the source power frequency can be matched or nearly matched at VHF frequencies; and that it is highly advantageous that such a frequency match or near-match be implemented. In an exemplary embodiment, the electrode-plasma resonance frequency corresponding to the foregoing values of plasma negative capacitance is approximately 200 MHz, as will be detailed below. The source power frequency is 210 MHz, a near-match in which the source power frequency is offset slightly above the electrode-plasma resonance frequency in order to realize other advantages to be discussed below.

The plasma capacitance is a function of among other things, plasma electron density. This is related to plasma ion density, which needs, in order to provide good plasma processing conditions, to be kept in a range generally $10^9$ to $10^{12}$ ions/cc. This density, together with the source power frequency and other parameters, determines the plasma negative capacitance, the selection of which is therefore constrained by the need to optimize plasma processing conditions, as will be further detailed below. But the overhead electrode assembly capacitance is affected by many physical factors, e.g. gap length (spacing between electrode 125 and the wafer); the area of electrode 125; the range of the dielectric loss tangent for the dielectric seal 130; the choice of dielectric constant of the dielectric seal 130 between electrode 125 and grounded chamber body 127; the choice of dielectric constant for the process kit dielectric seal 130; and the thickness of the dielectric seals 130 and 120 and the thickness and dielectric constant of the ring 180. This permits some adjustment of the electrode assembly capacitance through choices made among these and other physical factors affecting the overhead electrode capacitance. We have found that the range of this adjustment is sufficient to achieve the necessary degree of matching of the overhead electrode assembly capacitance to the magnitude of the negative plasma capacitance. In particular, the dielectric materials and dimensions for the seal 130 and ring 120 are chosen to provide the desired dielectric constants and resulting dielectric values. Matching the electrode capacitance and the plasma capacitance can then be achieved despite the fact that some of the same physical factors influencing electrode capacitance, particularly gap length, will be dictated or limited by the following practicalities: the need to handle larger diameter wafers; to do so with good uniformity of distribution of plasma ion density over the full diameter of the wafer; and to have good control of ion density vs ion energy.

Given the foregoing range for the plasma capacitance and the matching overhead electrode capacitance, the electrode-plasma resonance frequency was approximately 200 MHz for a source power frequency of 210 MHz.

A great advantage of choosing the capacitance of the electrode assembly 126 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. The entire processing system is rendered less sensitive to variations in operating conditions, e.g., shifts in plasma impedance, and therefore more reliable along with a greater range of process applicability. As will be discussed later in the specification, this advantage is further enhanced by the small offset between the electrode-plasma resonant frequency and the source power frequency.

Why the Plasma has a Negative Capacitance:

The capacitance of the plasma is governed by the electrical permittivity of the plasma, $\epsilon$, which is a complex number and is a function of the electrical permittivity of free space $\epsilon_0$, the plasma electron frequency $\omega_{pe}$, the source power frequency w and the electron-neutral collision frequency $n_{er}$, in accordance with the following equation:

$$\epsilon = \epsilon_0 [1 - \omega_{pe}^2/(\omega(\omega + i\nu_{en}))] \text{ where } i = (-1)^{1/2}.$$

(The plasma electron frequency $\omega_{pe}$ is a simple function of the plasma electron density and is defined in well-known publications on plasma processing.)

In one working example, the neutral species was Argon, the plasma electron frequency was about 230 MHz, the RF source power frequency was about 210 MHz with chamber pressure in the range of 10 mT to 200 mT with sufficient RF power applied so that the plasma density was between $10^9$ and $10^{12}$ cc$^{-1}$. Under these conditions, which are typical of those favorable to plasma etch processes, the plasma generally has a negative capacitance because its effective electrical permittivity defined by the foregoing equation is negative. Under these conditions, the plasma had a negative capacitance of −50 to −400 pico farads. Then as we have seen above in more general terms, the plasma capacitance, as a function of plasma electron density (as well as source power frequency and electron-neutral collision frequency) tends to be generally limited by favored plasma process realities for key applications such as dielectric etch, metal etch and CVD, to certain desired ranges, and to have a negative value at VHF source power frequencies. By exploiting these characteristics of the plasma, the electrode capacitance matching and frequency-matching features of the reactor achieve a process window capability and flexibility and stability of operation not previously possible.

Impedance Transformation Provided by the Stub 135:

The stub 135 provides an impedance transformation between the 50 Ω output impedance of the RF generator 150 and the load impedance presented by the combination of the electrode assembly 126 and the plasma within the chamber. For such an impedance match, there must be little or no reflection of RF power at the generator-stub connection and at the stub-electrode connection (at least no reflection exceeding the VSWR limits of the RF generator 150). How this is accomplished will now be described.

At the desired VHF frequency of the generator 150 and at a plasma density and chamber pressure favorable for plasma etch processes (i.e., $10^9$–$10^{12}$ ions/cm$^3$ and 10 mT–200 mT, respectively), the impedance of the plasma itself is about $(0.3+(i)7)\Omega$, where 0.3 is the real part of the plasma impedance, $i=(-1)^{1/2}$, and 7 is the imaginary part of the plasma impedance. The load impedance presented by the electrode-plasma combination is a function of this plasma impedance and of the capacitance of the electrode assembly 126. As described above, the capacitance of the electrode assembly 126 is selected to achieve a resonance between the electrode assembly 126 and the plasma with an electrode-plasma resonant frequency of about 200 MHz. Reflections of RF power at the stub-electrode interface are minimized or avoided because the resonant frequency of the stub 135 is set to be at or near the electrode-plasma resonant frequency so that the two at least nearly resonate together.

At the same time, reflections of RF power at the generator-stub interface are minimized or avoided because the location of the tap 160 along the axial length of the stub 135 is such that, at the tap 160, the ratio of the standing wave voltage to the standing wave current in the stub 135 is near the output impedance of the generator 150 or characteristic impedance of the cable 162 (both being about 50 W). How the tap 160 is located to achieve this will now be discussed.

Axial Location of the Stub's Tap 160:

The axial length of the coaxial stub 135 preferably is a multiple of a quarter wavelength of a "stub" frequency (e.g., 220 MHz) which, as stated above, is near the electrode-plasma resonant frequency. In an exemplary embodiment, this multiple is two, so that the coaxial stub length is about a half wavelength of the "stub" frequency, or about 29 inches.

Figure 2A:
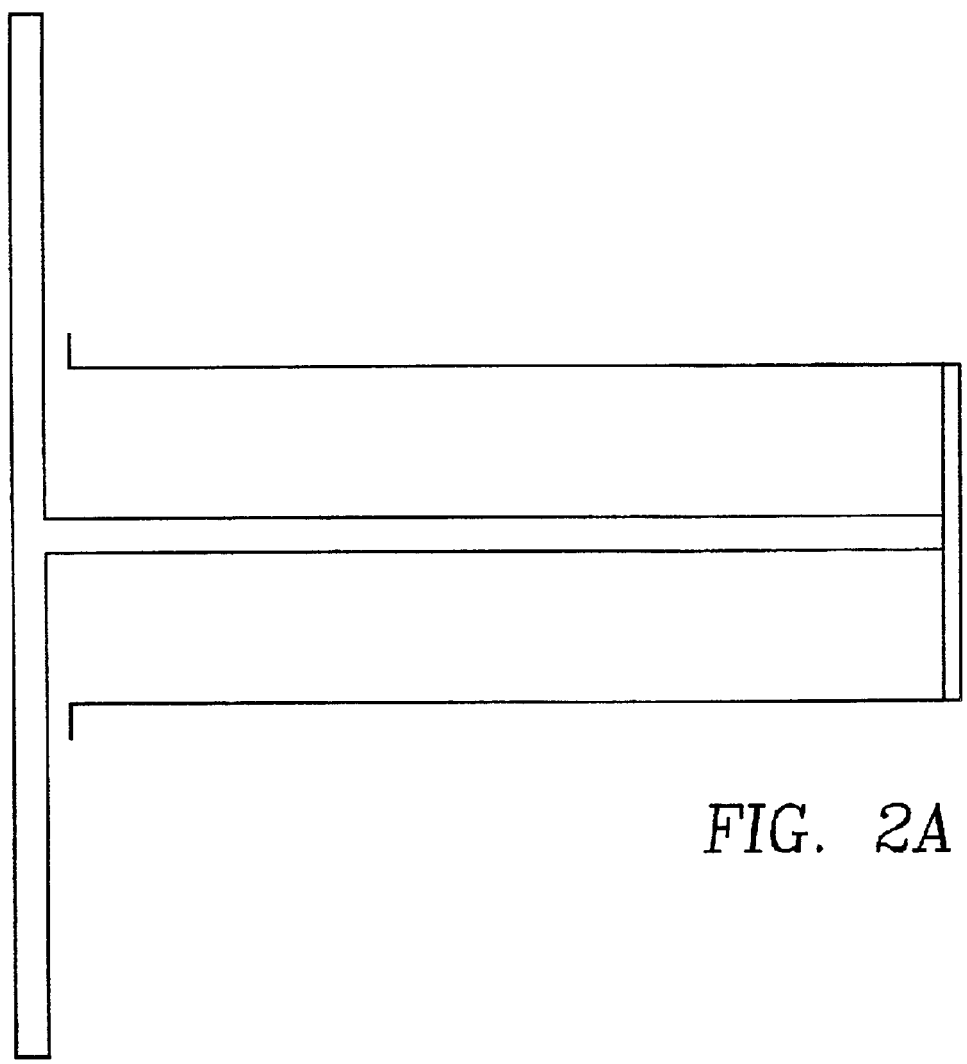
FIGS. 2A and 2B are diagrams illustrating, respectively, the coaxial stub of FIG. 1 and the voltage and current standing wave amplitudes as a function of position along the coaxial stub.
Figure 2B:
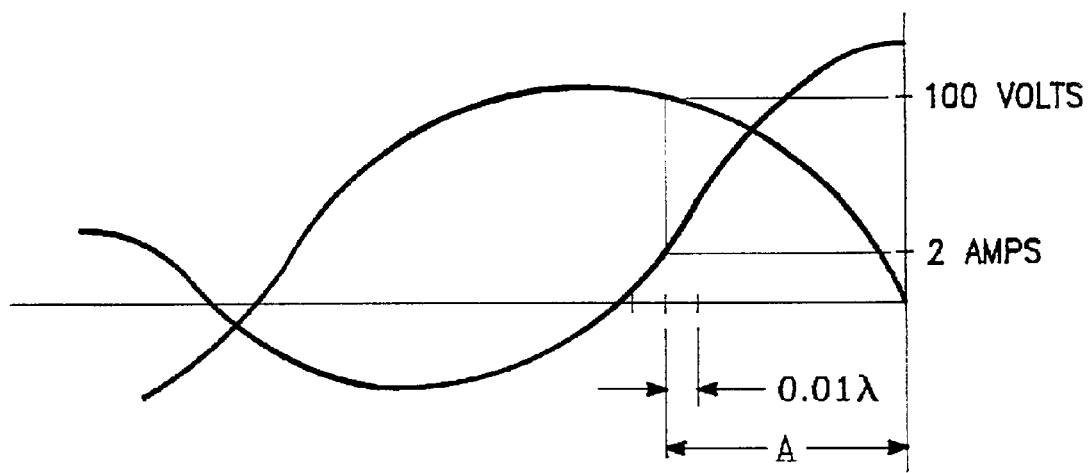

The tap 160 is at a particular axial location along the length of the stub 135. At this location, the ratio between the amplitudes of the standing wave voltage and the standing wave current of an RF signal at the output frequency of the generator 150 corresponds to an input impedance matching the output impedance of the RF generator 150 (e.g., 50 Ohms). This is illustrated in FIGS. 2A and 2B, in which the voltage and current standing waves in the stub 135 have a null and a peak, respectively, at the shorted outer stub end 135a. A desired location for the tap 160 is at a distance A inwardly from the shorted end, where the ratio of the standing wave voltage and current corresponds to 50 Ohms. This location is readily found by the skilled worker by empirically determining where the standing wave ratio is 50 Ohms. The distance or location A of the tap 160 that provides a match to the RF generator output impedance (50 $\Omega$) is a function of the characteristic impedance of the stub 135, as will be described later in this specification. When the tap 160 is located precisely at the distance A, the impedance match space accommodates a 9:1 change in the real part of the load impedance, if the RF generator is of the typical kind that can maintain constant delivered power over a 3:1 voltage standing wave ratio (VSWR).

In an exemplary embodiment, the impedance match space is greatly expanded to accommodate a nearly 60:1 change in the real part of the load impedance. This dramatic result is achieved by slightly shifting the tap 160 from the precise 50 W point at location A toward the shorted external end 135a of the coaxial stub 135. This shift is, for example, 5% of a wavelength in the exemplary embodiment (i.e., about 1.5 inch). It is a discovery of the reactor that at this slightly shifted tap location, the RF current contribution at the tap 160 subtracts or adds to the current in the stub, which ever becomes appropriate, to compensate for fluctuations in the plasma load impedance, as will be described below with reference to FIGS. 3 and 4. This compensation is sufficient to increase the match space from one that accommodates a 9:1 swing in the real part of the load impedance to a 60:1 swing.

It is felt that this behavior is due to a tendency of the phase of the standing wave current in the stub 135 to become more sensitive to an impedance mismatch with the electrode-plasma load impedance, as the tap point is moved away from the "match" location at A. As described above, the electrode assembly 126 is matched to the negative capacitance of the plasma under nominal operating conditions. This capacitance is –50 to –400 pico farads at the preferred VHF source power frequency (210 MHz). At this capacitance the plasma exhibits a plasma impedance of $(0.3+i7)\Omega$. Thus, 0.3 $\Omega$ is the real part of the plasma impedance for which the system is tuned. As plasma conditions fluctuate, the plasma capacitance and impedance fluctuate away from their nominal values. As the plasma capacitance fluctuates from that to which the electrode 125 was matched, the phase of the electrode-plasma resonance changes, which affects the phase of the current in the stub 135. As the phase of the stub's standing wave current thus shifts, the RF generator current supplied to the tap 160 will either add to or subtract from the stub standing wave current, depending upon the direction of the phase shift. The displacement of the tap 160 from the 50 $\Omega$ location at A is limited to a small fraction of the wavelength (e.g., 5%).

Figure 3:
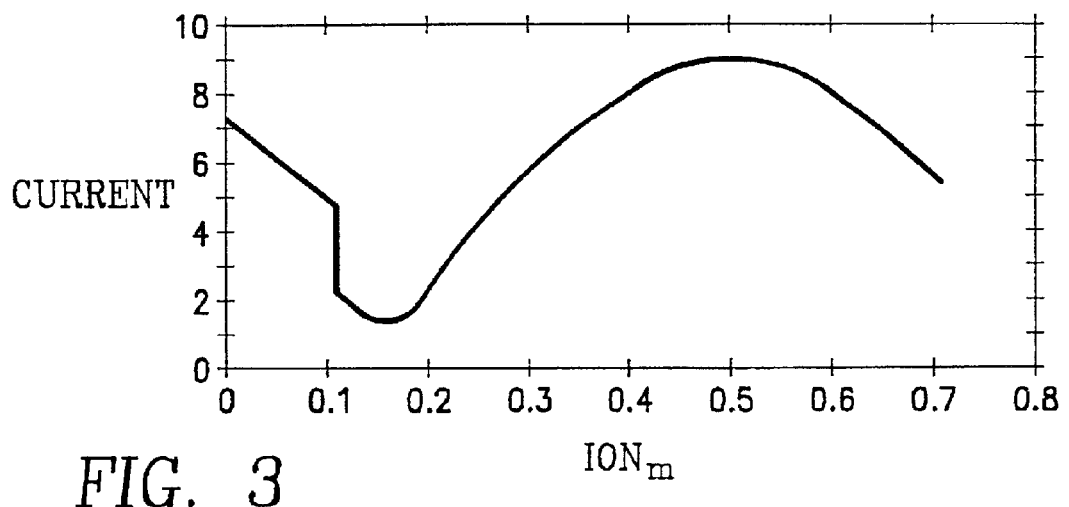
FIG. 3 illustrates the subtraction of current at the input power tap point on the coaxial stub that occurs in response to high plasma load impedance to maintain a more constant delivered VHF power level in a larger match space.

FIG. 3 illustrates the standing wave current in the stub 135 when the real part of the plasma impedance has increased due to plasma fluctuations. In FIG. 3, the current standing wave amplitude is plotted as a function of axial location along the stub 135. A discontinuity in the standing wave current amplitude at the location 0.1 on the horizontal axis corresponds to the position of the tap 160. In the graph of FIG. 3, an impedance mismatch occurs because the real part of the plasma impedance is high, above the nominal plasma impedance for which the system is tuned (i.e., at which the electrode capacitance matches the negative plasma capacitance). In this case, the current at the tap 160 subtracts from the standing wave current in the stub 135. This subtraction causes the discontinuity or null in the graph of FIG. 3, and reduces the delivered power to offset the increased load. This avoids a corresponding increase in delivered power ($I^2R$), due to the higher load (R).

Figure 4:
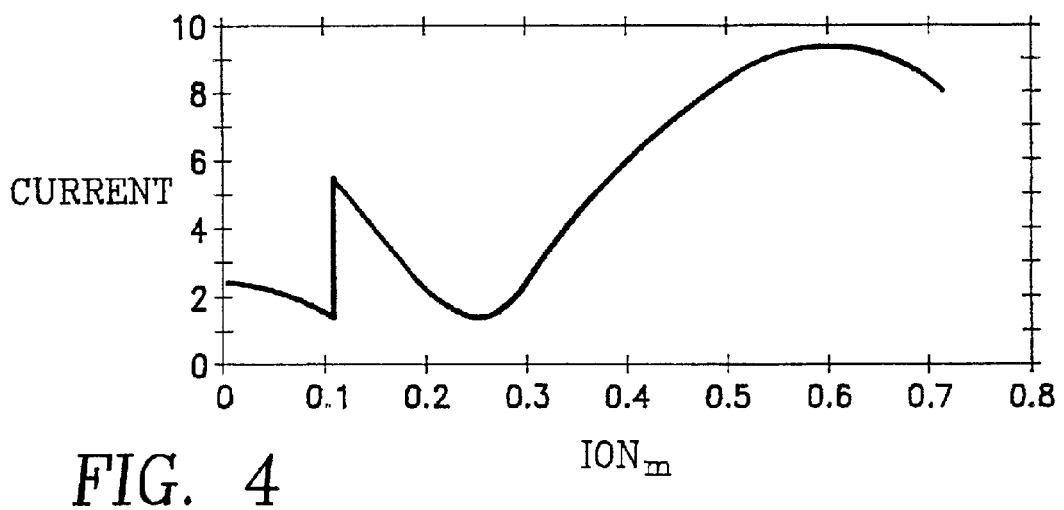
FIG. 4 illustrates the addition of current at the input power tap point on the coaxial stub that occurs in response to low plasma load impedance to maintain a more constant delivered VHF power level in a larger match space.

FIG. 4 illustrates the standing wave current in the stub 135 when the real part of the plasma impedance decreases. In FIG. 4, the current standing wave amplitude is plotted as a function of axial location along the stub 135. A discontinuity in the standing wave current amplitude at the location 0.1 marks the position of the tap 160. In the graph of FIG. 4, the real part of the plasma impedance is low, below the nominal plasma impedance for which the system is tuned. In this case, the current at the tap 160 adds to the standing wave current in the stub 135. This addition increases the delivered power to offset the decreased load, to avoid a concomitant decrease in delivered power, $I^2R$, due to the decreased load, R. With such compensation, much greater changes in load impedance can be accommodated so that the match space in increased significantly.

This expansion of the match space to accommodate a 60:1 swing in the real part of the load impedance enhances process window and reliability of the reactor. This is because as operating conditions shift during a particular process or application, or as the reactor is operated with different operating recipes for different applications, the plasma impedance will change, particularly the real part of the impedance. In the prior art, such a change could readily exceed the range of the conventional match circuit employed in the system, so that the delivered power could no longer be controlled sufficiently to support a viable process, and the process could fail. In the present reactor, the range of the real part of the load impedance over which delivered power can be maintained at a desired level has been increased so much that changes in plasma impedance, which formerly would have led to a process failure, have little or no effect on a reactor embodying this aspect of the invention. Thus, the invention enables the reactor to withstand far greater changes in operating conditions during a particular process or application. Alternatively, it enables the reactor to be used in many different applications involving a wider range of process conditions, a significant advantage.

As a further advantage, the coaxial stub 135 that provides this broadened impedance match is a simple passive device with no "moving parts" such as a variable capacitor/servo or a variable frequency/servo typical of conventional impedance match apparatus. It is thus inexpensive and far more reliable than the impedance match apparatus that it replaces.

De-Tuning the Operating and Resonant Frequencies to Broaden the Process Window:

In accordance with a further aspect, the system Q is reduced to broaden the process window by slightly offsetting the stub resonant frequency, the electrode plasma resonant frequency and the plasma source power frequency from one another. As described above, the stub resonant frequency is that frequency at which the axial length of the stub 135 is a half wavelength, and the electrode-plasma resonant frequency is the frequency at which the electrode assembly 126 and the plasma resonate together. In an exemplary embodiment, the stub 135 was cut to a length at which its resonant frequency was 220 MHz, the RF source power generator 150 was selected to operate at 210 MHz and the resulting electrode-plasma resonant frequency was about 200 MHz.

By choosing three such differing frequencies for plasma resonance, stub resonance and source power frequency, rather than the same frequency for all three, the system has been somewhat "de-tuned". It therefore has a lower "Q". The use of the higher VHF source power frequency proportionately decreases the Q as well (in addition to facilitating the match of the electrode and plasma capacitances under etch-favorable operating conditions).

Decreasing system Q broadens the impedance match space of the system, so that its performance is not as susceptible to changes in plasma conditions or deviations from manufacturing tolerances. For example, the electrode-plasma resonance may fluctuate due to fluctuations in plasma conditions. With a smaller Q, the resonance between the stub 135 and the electrode-plasma combination that is necessary for an impedance match (as described previously in this specification) changes less for a given change in the plasma-electrode resonance. As a result, fluctuations in plasma conditions have less effect on the impedance match. Specifically, a given deviation in plasma operating conditions produces a smaller increase in VSWR at the output of RF generator 150. Thus, the reactor may be operated in a wider window of plasma process conditions (pressure, source power level, source power frequency, plasma density, etc). Moreover, manufacturing tolerances may be relaxed to save cost and a more uniform performance among reactors of the same model design is achieved, a significant advantage. A related advantage is that the same reactor may have a sufficiently wide process window to be useful for operating different process recipes and different applications, such as conductor etch, dielectric etch and/or chemical vapor deposition.

Minimizing the Stub Characteristic Impedance to Broaden the Process Window:

Another choice that broadens the tuning space or decreases the system Q is to decrease the characteristic impedance of the stub 135. However, the stub characteristic impedance preferably exceeds the generator output impedance, to preserve adequate match space. Therefore, the system Q is preferably reduced, but only to the extent of reducing the amount by which the characteristic impedance of the stub 135 exceeds the output impedance of the signal generator 150.

The characteristic impedance of the coaxial stub 135 is a function of the radii of the inner and outer conductors 140, 145 and of the dielectric constant of the insulator 147 therebetween. The stub characteristic impedance is chosen to provide the requisite impedance transformation between the output impedance of the plasma power source 150 and the input impedance at the electrode 135. This characteristic impedance lies between a minimum characteristic impedance and a maximum characteristic impedance. Changing the characteristic impedance of the stub 135 changes the waveforms of FIG. 2 and therefore changes the desired location of the tap 160 (i.e., its displacement, A, from the far end of the stub 135). The allowable minimum characteristic impedance of the stub 135 is the one at which the distance A of FIG. 2 is zero so that tap 160 would have to be located on the far end 135a of the coaxial stub 135 opposite the electrode 125 in order to see a 50 Ohm ratio between the standing wave current and voltage. The allowable maximum characteristic impedance of the stub 135 is the one at which the distance A of FIG. 2 is equal to the length of the stub 135 so that the tap 160 would have to be close the near end 135b of the coaxial stub 135 adjacent the electrode 125 in order to see a 50 Ohm ratio between the standing wave current and voltage.

In an initial embodiment, the coaxial stub characteristic impedance was chosen to be greater (by about 30%) than the output impedance of the RF generator 150, in order to provide an adequate match space. The stub impedance must exceed the RF generator output impedance because the impedance match condition is achieved by selecting the location of the tap point 160 to satisfy $$Z_{gen} = a^2 [Z_{stub}^2 / r_{plasma}]$$

where a is determined by the location of the tap point and varies between zero and one. (a corresponds to the ratio of the inductance of the small portion of the stub 135 between the far end 135b and the tap 160 to the inductance of the entire stub 135.) Since a cannot exceed one, the stub characteristic impedance must exceed the generator output impedance in order to find a solution to the foregoing equation. However, since the Q of the system is directly proportional to the stub characteristic impedance, the amount by which the stub characteristic impedance exceeds the generator output impedance preferably is somewhat minimized to keep the Q as low as practical. In the exemplary embodiment, the stub characteristic impedance exceeds the generator output impedance by only about 15 Ω.

However, in other embodiments, the coaxial stub characteristic impedance may be chosen to be less than the plasma power source (generator) output impedance to achieve greater power efficiency with some reduction in impedance match.

Increased Power Efficiency Provided by the Impedance Transformation of the Stub:

As discussed earlier in this specification, plasma operating conditions (e.g., plasma density) that favor plasma etch processes result in a plasma impedance that has a very small real (resistive) part (e.g., less 0.3 Ohm) and a small imaginary (reactive) part (e.g., 7 Ohms). Capacitive losses predominate in the combination electrode-plasma area of the system, because the electrode capacitance is the predominant impedance to power flow in that part of the reactor. Therefore, power loss in the electrode-plasma combination is proportional to the voltage on the electrode-plasma combination. In contrast, inductive and resistive losses predominate in the stub 135, because the inductance and resistance of the stub 135 are the predominant elements of impedance to power flow in the stub 135. Therefore, power loss in the stub 135 is proportional to current in the stub. The stub characteristic impedance is much greater than the real part of the impedance presented by the electrode-plasma combination. Therefore, in the higher impedance stub 135 the voltage will be higher and the current lower than in the lower impedance plasma in which the current will be higher and the voltage lower. Thus, the impedance transformation between the stub 135 and the plasma-electrode combination produces a higher voltage and lower current in the stub 135 (where resistive and inductive losses dominate and where these are now minimized) and a correspondingly lower voltage and higher current at the plasma/electrode (where capacitive losses dominate and where these are now minimized). In this manner overall power loss in the system is minimized so that power efficiency is greatly improved, a significant advantage. In an exemplary embodiment, power efficiency is about 95% or greater.

Thus, the stub 135, configured as described above, serves not only to provide an impedance match or transformation between the generator and the electrode-plasma impedances across a very wide range or window of operating conditions, but in addition provides a significant improvement in power efficiency.

Cross-Grounding:

The ion energy at the wafer surface can be controlled independently of the plasma density/overhead electrode power. Such independent control of the ion energy is achieved by applying an HE frequency bias power source to the wafer. This frequency, (typically 13.56 MHz) is significantly lower than the VHF power applied to the overhead electrode that governs plasma density. Bias power is applied to the wafer by a bias power HF signal generator 200 coupled through a conventional impedance match circuit 210 to the wafer support 105. The power level of the bias generator 200 controls the ion energy near the wafer surface, and is generally a fraction of the power level of the plasma source power generator 150.

As referred to above, the coaxial stub 135 includes a shorting conductor 165 at the outer stub end providing a short circuit between the inner and outer coaxial stub conductors 140, 145. The shorting conductor 165 establishes the location of the VHF standing wave current peak and the VHF standing wave voltage null as in FIG. 2. However, the shorting conductor 165 does not short out the VHF applied power, because of the coupling of the stub resonance and the plasma/electrode resonance, both of which are at or near the VHF source power frequency. The conductor 165 does appear as a direct short to ground for other frequencies, however, such as the HF bias power source (from the HF bias generator 200) applied to the wafer. It also shorts out higher frequencies such as harmonics of the VHF source power frequency generated in the plasma sheath.

The combination of the wafer 110 and wafer support 105, the HF impedance match circuit 210 and the HF bias power source 200 connected thereto provides a very low impedance or near short to ground for the VHF power applied to the overhead electrode 125. As a result, the system is cross-grounded, the HF bias signal being returned to ground through the overhead electrode 125 and the shorted coaxial stub 135, and the VHF power signal on the overhead electrode 135 being returned to ground through a very low impedance path (for VHF) through the wafer, the HF bias impedance match 210 and the HF bias power generator 200.

The exposed portion of the chamber side wall between the plane of the wafer and the plane of the overhead electrode 125 plays little or no role as a direct return path for the VHF power applied to the overhead electrode 125 because of the large area of the electrode 125 and the relatively short electrode-to-wafer gap. In fact, the side wall of the chamber may be isolated from the plasma using magnetic isolation or a dielectric coating or an annular dielectric insert or removable liner.

In order to confine current flow of the VHF plasma source power emanating from the overhead electrode 125 within the vertical electrode-to-pedestal pathway and away from other parts of the chamber 100 such as the sidewall, the effective ground or return electrode area in the plane of the wafer 110 is enlarged beyond the physical area of the wafer or wafer support 105, so that it exceeds the area of the overhead electrode 125. This is achieved by the provision of the annular process kit 115, a conductive or semiconductive ring portion of which may be generally coplanar with and surrounding the wafer 110 and provides a stray capacitance to the grounded chamber body. This extends the effective radius of the "return" electrode in the plane of the wafer 110 for the VHF power signal from the overhead electrode. In an exemplary embodiment, the conductive or semiconductive ring portion of the process kit 115 is insulated from the grounded chamber body by a dielectric ring portion 120 of the process kit 115. The thickness and dielectric constant of the dielectric ring 120 is selected to achieve a desirable ratio of VHF ground currents through the wafer 110 and through the conductive or semiconductive ring portion of the process kit 115.

In order to confine current flow from the HF plasma bias power from the bias generator 200 within the vertical path between the surface of the wafer and the electrode 125 and avoid current flow to other parts of the chamber (e.g., the sidewall), the overhead electrode 135 provides an effective HF return electrode area significantly greater than the area of the wafer or wafer support 105. The ring portion of the process kit 115 in the plane of the wafer support 105 does not play a significant role in coupling the HF bias power into the chamber, so that the effective electrode area for coupling the HF bias power is essentially confined to the area of the wafer and wafer support 105.

Enhancement of Plasma Stability:

Plasma stability was enhanced by eliminating D.C. coupling of the plasma to the shorting conductor 165 connected across the inner and outer stub conductors 140, 145 at the back of the stub 135. This is accomplished by the provision of the thin capacitive ring 180 between the coaxial stub inner conductor 140 and the electrode 125. In the embodiment of FIG. 1, the ring 180 is sandwiched between the electrode 125 on the bottom and the conductive annular inner housing support 176. In the exemplary embodiments described herein, the capacitive ring 180 had a capacitance of about 180 picoFarads, depending on the frequency of the bias chosen, about 13 MHz. With such a value of capacitance, the capacitive ring 180 does not impede the cross-grounding feature described above. In the cross-grounding feature, the HF bias signal on the wafer pedestal is returned to the RF return terminal of the HF bias generator 150 via the stub 135 while the VHF source power signal from the electrode 125 is returned to the RF return terminal of the VHF source power generator 150 via the wafer pedestal.

Figure 5:
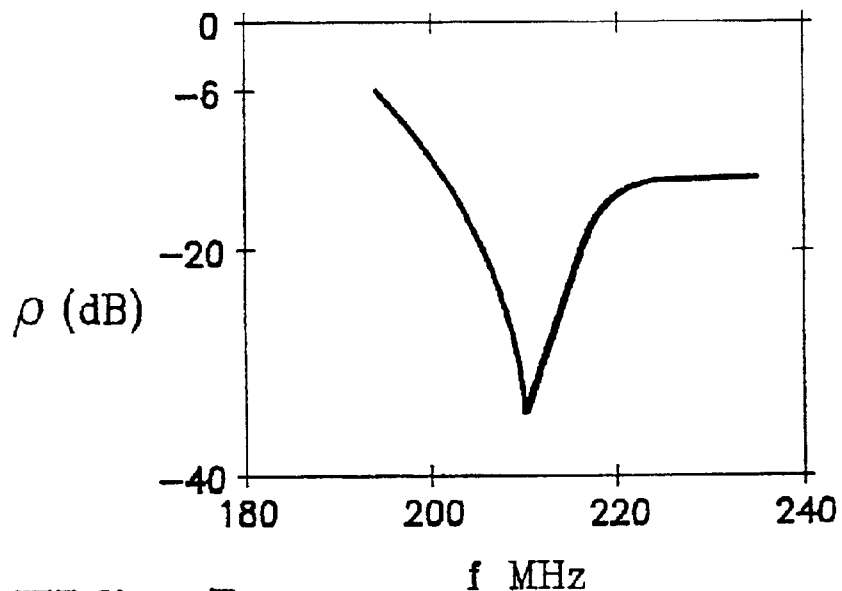
FIG. 5 is a graph illustrating the low-Q reflection coefficient as a function of frequency of the embodiment of FIG. 1.

FIG. 5 is a graph illustrating the reflection coefficient between the VHF power source and the overhead electrode 125 as a function of frequency. This graph illustrates the existence of a very broad band of frequencies over which the reflection coefficient is below 6 dB, which is indicative of the highly advantageous low system Q discussed above.

Figure 6:
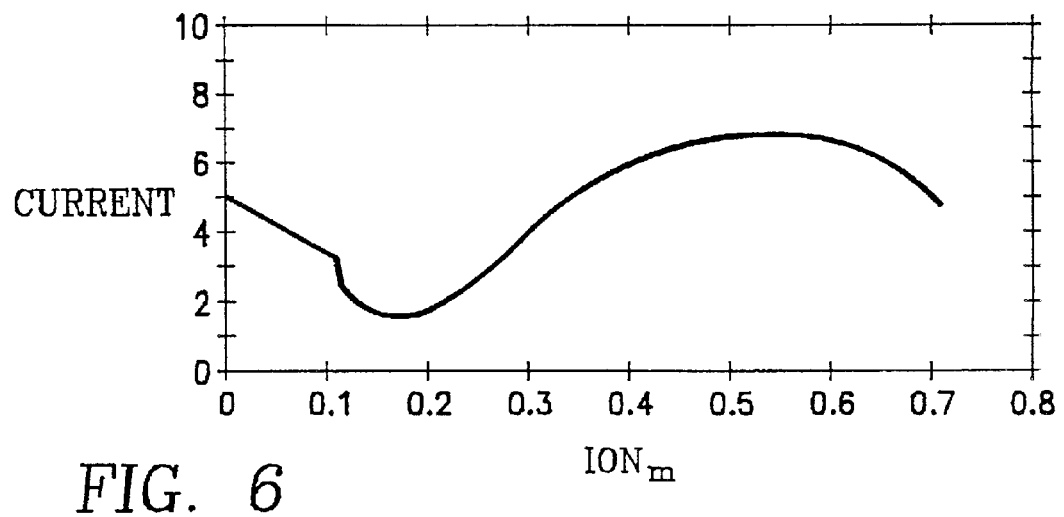
FIG. 6 is a graph illustrating the interaction of the current contribution at the input power tap point on the coaxial stub with the standing wave current and voltage along the stub length.

FIG. 6 illustrates the standing wave current as a function of position along the coaxial stub 135 in the case in which the tap 160 is placed at the distance A of FIG. 2B from the shorted end of the stub.

Figure 7:
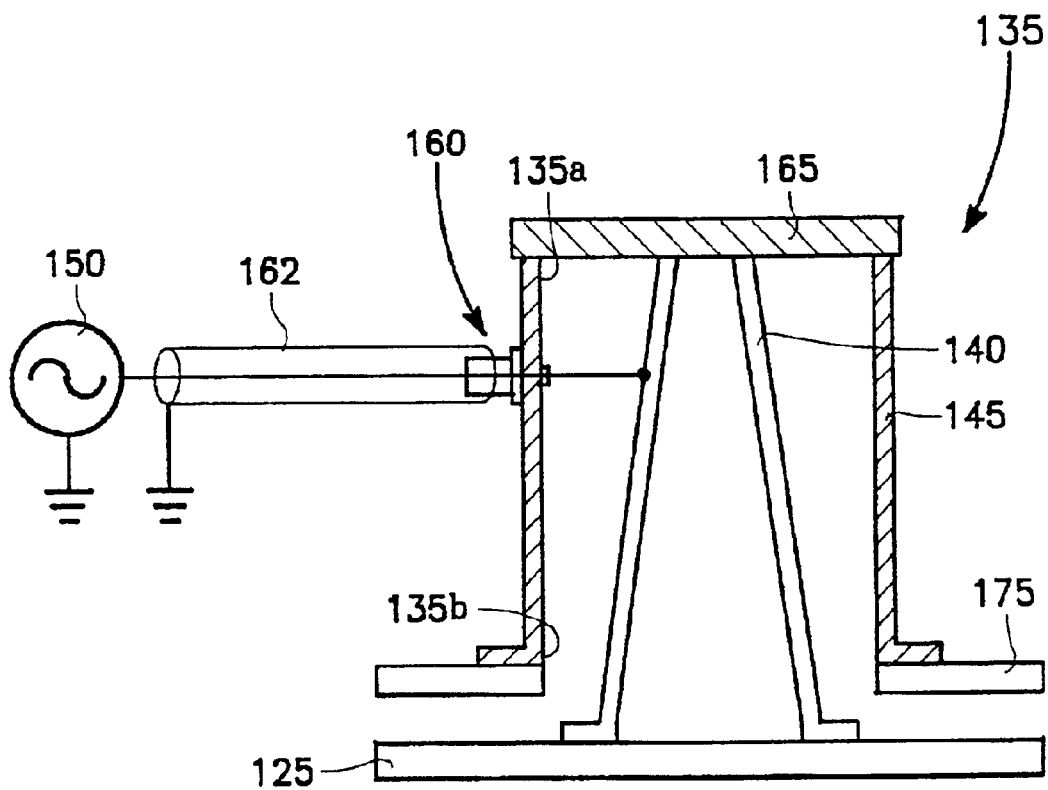
FIG. 7 illustrates an alternative embodiment of the coaxial stub of FIG. 1.

FIG. 7 illustrates an alternative embodiment of the reactor in which the inner conductor 140 of the coaxial stub 135 is tapered, having a larger radius at the near stub end 135b adjacent the overhead electrode 125 and a smaller radius at the far stub end 135a. This feature provides a transition between a low impedance (e.g., 50 W) presented by the coaxial stub 135 at the tap 160 and a higher impedance (e.g., 64 W) presented by the coaxial stub 135 at the overhead electrode 125. Also, as shown in FIG. 7, the stub 135 need not be curved but instead can be straight.

As can be understood from the foregoing description, the inventive chamber concerns a capacitively coupled reactor having an overhead electrode that is driven by a VHF plasma source power RF supply, rather than an HF power supply. We have found that at a VHF source power frequency, unlike an HF frequency, it is practical to tune the overhead electrode to resonate with the plasma, leading to heretofore unattained stability and efficiency and many other advantages.

The VHF capacitively coupled plasma reactor of the foregoing embodiment enjoys the advantage of very high etch selectivity and efficiency. The great efficiency gives this reactor the ability to produce relatively high density plasmas, rivaling those achieved in inductively coupled reactors. Yet, the VHF capacitively coupled reactor of the exhibits an etch selectivity that is far superior to that of an inductively coupled reactor. This is because the VHF capacitively coupled reactor experiences far less residence time of process gas species and therefore less dissociation of volatile species such as fluorine (relative to inductively coupled reactors).

Semiconductor device geometries are constantly being reduced by the microelectronics industry in order to achieve higher device speeds. Such an decrease in device size or geometry increases the aspect ratios of contact holes in the device structure, for example. As a result, etch processes must have correspondingly greater etch rates and etch selectivity. However, achieving a silicon dioxide high etch rate such as 9,000 Angstroms per minute with a high silicon oxide-to-photoresist etch selectivity on the order of 10:1 seems to be impractical, even with a highly efficient VHF capacitively coupled plasma reactor. This is because such performance would require a significant improvement in the plasma distribution uniformity over the wafer or workpiece surface that such a reactor produces. Otherwise, as device geometries shrink, the process becomes more susceptible to failure due to overetching (in regions of higher plasma ion density) or premature etch stopping (in areas of lower plasma density). In order to avoid the overetching problem, the overall plasma density must be reduced, which reduces etch rate. The great need therefore is to find a way to improve the plasma ion distribution uniformity.

If somehow the plasma ion density distribution uniformity could be improved in the VHF capacitively coupled reactor, then both excellent etch selectivity and high etch rate would be realized in the same reactor.

One type of reactor that has overcome the problem of non-uniform plasma density distribution is the magnetically enhanced reactive ion etch (MERIE) plasma reactor. An MERIE reactor is, typically, a capacitively coupled reactor in which HF frequency RF source power is applied to the wafer support pedestal and returned through the chamber ceiling or side walls. Its key feature is an array of electromagnets producing a slowly circulating magnetic field that circulates or stirs the plasma across the plane of the workpiece. This stirring action provides a highly uniform distribution of plasma density across the workpiece surface. However, an MERIE reactor does not enjoy the high plasma ion density and high etch rate of the VHF capacitively coupled reactor because it is not as efficient. Moreover, the MERIE reactor suffers from various problems:

(1) An MERIE reactor is prone to arcing between the wafer support pedestal and metallic feed lines within the wafer support pedestal. Such arcing diverts plasma source power from plasma ion generation, and therefore impairs control of the plasma ion density and therefore of the etch rate. In processes in which the etch rate is critical because of extremely small device geometries, such a loss of control may lead to process failure.

(2) An MERIE reactor must employ such a powerful magnet array (10–100 Gauss) that tends to promote device damage on the workpiece. Such a powerful magnetic field is necessary in order to produce a sufficient plasma density near the workpiece in addition to circulating the plasma. Such a powerful magnetic field is required to hold a significant portion of the plasma against the plasma sheath adjacent the workpiece or wafer.

The main drawback, however, of an MERIE reactor is that it is incapable of attaining the high plasma density that the VHF capacitively coupled reactor readily provides. Thus, it would seem that reactors capable of high plasma ion density and high etch selectivity (e.g., a VHF capacitively coupled reactor) must be incapable of providing a highly uniform plasma ion density distribution. Moreover, it would seem that a reactor having good plasma ion density distribution uniformity (e.g., an MERIE reactor) must be incapable of producing high plasma ion density.

A superior way to feed process gases into a capacitively coupled plasma reactor is to inject the process gases through the overhead ceiling. In the present capacitively coupled plasma reactor, the overhead ceiling is the source power electrode that is coupled to a VHF RF power generator through a coaxial stub or equivalent impedance match element. In order to inject the process gas from the ceiling, the ceiling electrode also is a "showerhead", a conductive layer having a set of small gas injection ports passing through it for injecting the process gases. In some instances plasma discharge or "arcing" tends to occur within the ceiling gas injection ports. This poses a risk of the plasma discharge removing material of the overhead electrode or showerhead from the interior surfaces of the gas injection ports. The species (e.g., metallic species) thus introduced into the plasma can contaminate the surface of the wafer or workpiece and damage the microelectronic devices being fabricated thereon.

Accordingly, it would be desirable to reduce or eliminate the tendency to ignite plasma within gas injection ports (or anywhere else outside of the bulk plasma), particularly in a plasma reactor having a combination overhead electrode/gas distribution showerhead connected to a VHF plasma source RF power supply.

The overhead electrode may suffer wear from being in contact with plasma, particularly since it is both an anode for the bias power and a cathode for the source power and is therefore subject to RF and DC currents. The cost of operating the reactor would be reduced if there could be found a way to avoid passing such currents directly through the overhead electrode or avoid direct contact of plasma with the electrode.

A problem generally found in plasma reactors is the generation of second and third harmonics within the plasma sheath. In the present reactor, while plasma VHF source power is applied by the overhead electrode, plasma bias power is applied by an HF signal on the wafer support pedestal. At HF frequencies most of the RF power is consumed in the sheath, the remainder sustaining the bulk plasma. A plasma sheath is a non-linear load and therefore creates second and/or third harmonics of the HF bias signal applied to the wafer support pedestal. The presence of such harmonics changes plasma behavior in such a way that process performance is impaired in the presence of such harmonics. Specifically, process control to avoid etch stop or over-etching becomes more difficult, and the etch rate is reduced. It would be desireable to reduce the production of such harmonics affecting the plasma In the present reactor, the coaxial tuning stub, whose length is correlated to the wavelength of the VHF source power signal, can have a footprint larger than the remainder of the reactor. It would therefore be advantageous to be able to reduce this footprint without sacrificing any of the advantages of the coaxial tuning stub.

It is a discovery of the present invention that combining certain features of the MERIE reactor with the VHF capacitively coupled reactor of FIGS. 1–7 solves the problems enumerated above for each of them, and that such a combination enjoys all the advantages and none of the disadvantages of the two types of reactors. A reactor in accordance with this combination is realized by adding an array of MERIE magnets to the VHF capacitively coupled reactor of FIGS. 1–7. The circulation of the plasma by the MERIE magnets solves the problem of plasma ion distribution non-uniformity in the VHF reactor. However, an MERIE reactor requires the process gases to be fed from an overhead gas distribution plate or showerhead. As will be discussed in detail below in this specification, providing such a gas distribution plate in the VHF capacitively coupled reactor of FIGS. 1–7 is fraught with problems due to the high plasma density of such a reactor. Specifically, such a reactor is susceptible to arcing within the gas injection ports in the gas distribution plate. In order to achieve the desired combination of the VHF capacitively coupled reactor with an MERIE reactor, the problem of arcing within the gas injection ports had to be solved, and this solution is described in a later section of this specification.

One suprising result of this combination is that the higher efficiency of the VHF reactor of FIGS. 1–7 produces such a high plasma density that the magnetic field of the MERIE magnets may be reduced by a factor two or more. Specifically, the MERIE magnetic field must typically lie in a range of about 10–100 Gauss. However, in the VHF capacitively coupled reactor, because of the much greater plasma ion density, an MERIE magnetic field can achieve the same plasma distribution uniformity with only half the field, about 30–60 Gauss. This is because the MERIE magnetic field needs to do less work to draw the same amount of plasma near the plasma sheath over the wafer which is stirred by the circulation of the MERIE magnetic field. Thus, the lesser magnetic field can provide the same optimum uniformity of plasma ion density distribution. The reduction in the magnetic field decreases the amount of device damage caused by plasma ions. The reduction by 50% in the MERIE magnetic field not only reduces device damage but essentially eliminates it. This solves the problem of device damage to which typical MERIE reactors are prone.

Another suprising result is that the presence of VHF source power prevents arcing at the wafer support pedestal that plagues typical MERIE reactors, as referred to above. This in turn greatly improves the process control in an MERIE reactor. Such arcing was prone to occur between the wafer support pedestal and metal gas or coolant feed lines within or under the wafer support pedestal.

In exemplary embodiments, the VHF source power frequency is well-above the cyclotron resonance frequency associated with the MERIE magnets. This prevents the formation of electron cyclotron resonance of plasma electrons with the field of the MERIE magnets, which would divert VHF source power from ion generation, and thereby inhibit control over the plasma ion density. The VHF source power frequency is selected as described above with reference to FIGS. 1–7 so that the plasma frequency is at or near the resonance frequency of the overhead electrode. This frequency is well-above the cyclotron resonance frequency associated with the field of the MERIE magnets (e.g., 30 Gauss). The electron cyclotron frequency is defined as:

$$qB/(m_e 2\pi)$$

where q is the charge of an electron, B is the magneic field of the MERIE magnet array, and $m_e$ is the electron mass. This equation shows that the cyclotron frequency is proportional to the magnetic field, and this points to the advantage realized by the use of VHF source power: As referred to above, the VHF capacitively coupled reactor of FIGS. 1–7 is capable of generating such a much higher plasma density than a conventional MERIE reactor that the MERIE magnetic field may be dramatically reduced when used in the VHF reactor. This not only results in a great decrease in device damage, as referred to above, but in addition reduces the electron cylcotron resonance frequency well below the VHF source power frequency. In one embodiment, the cyclotron resonance frequency associated with the MERIE magnets was computed to be about 150 MHz and the VHF source power frequency that resulted in near matching of the plasma resonant frequency with the overhead electrode resonant frequency was about 176 MHz. In other embodiments the VHF source power frequency is over 200 MHz, which is even further above the cyclotron resonance frequency.

The combination of the VHF capacitively coupled plasma reactor of FIGS. 1–7 with MERIE magnets results in a plasma reactor having three independently controllable parameters:

(1) the plasma ion density, controlled by the VHF source power level, (2) the ion energy at the wafer surface, controlled by the HF bias power level applied to the wafer support pedestal, (3) the degree of plasma ion uniformity distribution, controlled by the magnetic field of the MERIE magnets.

Such a reactor has outstanding performance. Specifically, the reactor can couple VHF source power of 4000 Watts to the plasma with about 95% efficiency for VHF frequencies up to 250 MHz, and for chamber pressures within a range of about 1 mT to 3000 mT.

In such an MERIE VHF reactor, the process gases are best introduced through the overhead VHF source power electrode. For this purpose, the overhead electrode is endowed with the function of a gas distribution showerhead, by providing an array of small gas injection nozzles or ports through the overhead electrode. The process gases are fed to these injection ports through the center conductor of the coaxial tuning stub. Since the center conductor is coupled to the overhead electrode, the process gas feeds are completely protected from the plasma and from electric fields.

Arcing and other potential issues are avoided while retaining all of the above-described advantages through any of a combination of features, one of which is to put the overhead electrode at a floating D.C. potential by capacitively isolating it from the VHF tuning stub. This is accomplished by placing a dielectric film between the coaxial tuning stub and the overhead electrode. This feature prevents DC plasma current from returning through the tuning stub via the overhead electrode, and thereby reduces arcing within the gas injection holes in the overhead electrode.

Another feature that reduces arcing is to provide capacitance between the plasma and the overhead electrode. For this purpose a dielectric layer is formed on the electrode surfaces of the overhead electrode that face the plasma. Preferably, this is done by anodizing such electrode surfaces, particularly the interior surfaces of the gas injection ports in the electrode. This feature helps to obviate plasma arcing in the gas injection ports in the overhead electrode. One reason for this is that the capacitance of the anodized electrode surfaces provides charge storage capacity which permits some charge of the RF current from the plasma to be stored rather than passing on to the electrode surfaces. To the extent charge is thus diverted from the surfaces of the gas inlet ports in the overhead electrode, plasma ignition therein is avoided.

In addition to avoiding plasma arcing within the gas injection ports of the overhead electrode, the feature of capacitively isolating the overhead electrode extends the useable life of the electrode because it results in no net D.C. current between the plasma and the electrode, a significant advantage.

In order to further reduce the risk of plasma arcing in the gas injection ports, another feature is introduced, namely a metal or ceramic "foam" layer between the coaxial stub and the capacitive layer lying between the electrode and the coaxial tuning stub. In one embodiment, the metal foam layer is of a diameter that is generally coextensive with the overhead electrode. The metal foam layer is of the commercially available type well-known in the art and typically consists of an aluminum matrix having a random cell structure. The advantage of the metal foam layer is that it suppresses electric fields near the electrode (i.e., within a plenum above the overhead electrode) and thereby reduces the tendency of plasma to arc inside the gas injection ports in the overhead electrode.

A metal foam layer is also employed to baffle the incoming process gas in order to achieve an even gas distribution across the array of gas injection ports in the overhead electrode. Preferably, the gas injection holes or ports in the overhead ceiling are divided into a radially inner group and a radially outer group. One metal foam layer baffles gas between a first gas supply and the outer group of ports, while another metal foam layer baffles gas between a second gas supply and the inner group of ports. The radial distribution of process gas flow may be adjusted by independently adjusting the gas flow rates of the two gas supplies.

As described in the above-referenced parent application, the coaxial tuning stub and overhead electrode offer a low impedance RF return path to ground for the HF bias power applied to the wafer support pedestal. However, it has been discovered that the new capacitive dielectric layer now inserted between the coaxial tuning stub and the overhead electrode can be used to tune the return HF path through the overhead electrode to a particular HF frequency. One advantage of the choice of a VHF source power frequency (on the overhead electrode) is that the capacitive layer (between the overhead electrode and the tuning stub), if tuned for HF frequencies, does not affect the VHF signal applied to the overhead electrode because it is an electrical short for a broad band of VHF frequencies.

Initially, a narrow HF frequency pass band to which the RF return path is tuned by the added capacitive layer was centered at the frequency of the HF bias source power applied to the wafer support pedestal. However, the problem of sheath-generated harmonics can be solved by instead selecting this capacitance to tune the HF return path through the overhead electrode to the second harmonic of the HF bias power signal. The result of this selection is that the HF second harmonic generated in the plasma sheath near the overhead electrode is shunted to ground through the overhead electrode before it can significantly affect the bulk plasma. The etch rate was found to be improved by this feature by 10% to 15% in one embodiment. In this case, it is believed the fundamental of the HF bias signal is returned to ground through other available RF paths, such as the chamber side wall.

As will be described below in detail, the selection of the capacitance of this added capacitive layer (between the overhead electrode and the tuning stub) for resonance at the selected HF frequency must take into account not only the capacitance of the thin plasma sheath at the overhead electrode but also the capacitance of the thick plasma sheath at the wafer support pedestal.

The highly efficient VHF plasma source of the present invention is capable of maintaining a plasma of sufficiently high density so that it may be used to thoroughly dry-clean the chamber interior periodically. As employed in this specification, the term "dry-clean" refers to a cleaning procedure requiring no application of liquid chemical agents but only the application of a plasma, so that the vacuum enclosure need not be opened. Since in this manner the chamber can be thoroughly cleaned of polymer residue, its surfaces during wafer processing may be kept at a sufficiently high temperature to continually evaporate any polymer deposits thereon, so that the chamber is kept at least nearly free of polymer deposits throughout processing. (In contrast, for a reactor that cannot be thoroughly cleaned, plasma conditions must be controlled so that polymer deposits on chamber wall surfaces continue to adhere rather than being removed, to avoid contamination of the process.) For this purpose, the overhead electrode assembly includes liquid passages for introducing fluid for heating or cooling the overhead electrode, enabling temperature control of the external surfaces thereof. Preferably, the plasma conditions (ion energy, wall temperatures, etc.) are such that no polymer accumulates on the chamber surfaces during processing. Any minor accumulations are thoroughly removed during cleaning.

One advantage of such a feature is that an optical window may be provided on or adjacent the overhead electrode, because it will remain clear or free of polymer deposits during processing. Thus, the reactor performance may be optically monitored. Accordingly, the overhead electrode optionally includes an optical window near its center, with a light transmitting optical fiber cable extending upwardly for connection to sensors outside of the chamber. The optical monitoring of the plasma process may be employed to perform end-point detection. For example, the optical monitor may measure decreasing layer thickness in a plasma etch process or increasing layer thickness in a plasma-assisted chemical vapor deposition process, using conventional optical measurement techniques.

In order to solve the problem of contamination from material of the exposed surfaces of the overhead electrode entering the plasma and eventually reaching the wafer or workpiece, an additional outer layer is introduced onto the bottom (plasma-facing) surface of the overhead electrode. This additional outer layer is formed of a material compatible with the particular process being carried out. For example, in a silicon dioxide etch process, the outer layer on the overhead electrode would be silicon or silicon carbide. Optionally, prior to the placement of this outer layer, the overhead electrode plasma-facing surface is anodized, as mentioned hereinabove.

Another discovery of the present invention is that the plasma can exhibit a greater resistive load impedance variation and a smaller reactive load impedance variation than was earlier expected. Specifically, the resistive load impedance may vary by as much as 100:1 (instead of 60:1) while the reactive load impedance may vary by only 20% (instead of 35%). This difference enables the characteristic impedance of the coaxial tuning stub to be reduced from 65 Ohms (above the RF generator's 50 Ohm output impedance) down to 30 Ohms (below the RF generator's output impedance). This reduction achieves a proportional increase in tuning space with a very small compromise in efficiency. Specifically, the range of variations in plasma resistive load impedance which can be matched by the tuning stub is increased from 60:1 (as in the parent application) to 100:1, due to the reduction in coaxial stub characteristic impedance. The characteristic impedance of the coaxial stub is determined by the radii of its inner and outer conductors, as set forth in the above-referenced parent application.

In order to reduce the footprint of the coaxial tuning stub, an equivalent strip line circuit is substituted in its stead. The outer conductor of the coaxial tuning stub becomes a ground plane surface as the metal lid capping the reactor, while the center conductor of the coaxial tuning stub becomes the strip line conductor. The characteristic impedance of the strip line conductor is adjusted by adjusting the spacing between the strip line conductor and the ground plane (the lid). The footprint of the tuning device is reduced because, while the coaxial tuning stub extends along a straight line, the strip line conductor can wind around circularly inside the lid, thereby reducing the area or footprint. All of the features of the coaxial tuning stub are retained in the strip line circuit. Thus, the length of the strip line conductor is determined in the same manner as the length of the coaxial tuning stub as described above. Also, the location along the length of the strip line conductor for the feed point or tap connected to the VHF generator is the same as that of the tap to the coaxial tuning stub as described in the above-referenced parent application. Also, the strip line conductor is hollow and utilities are fed through the strip line conductor, in the same manner that utilities are fed through the coaxial tuning stub center conductor as described in the above-referenced parent application.

Figure 8:
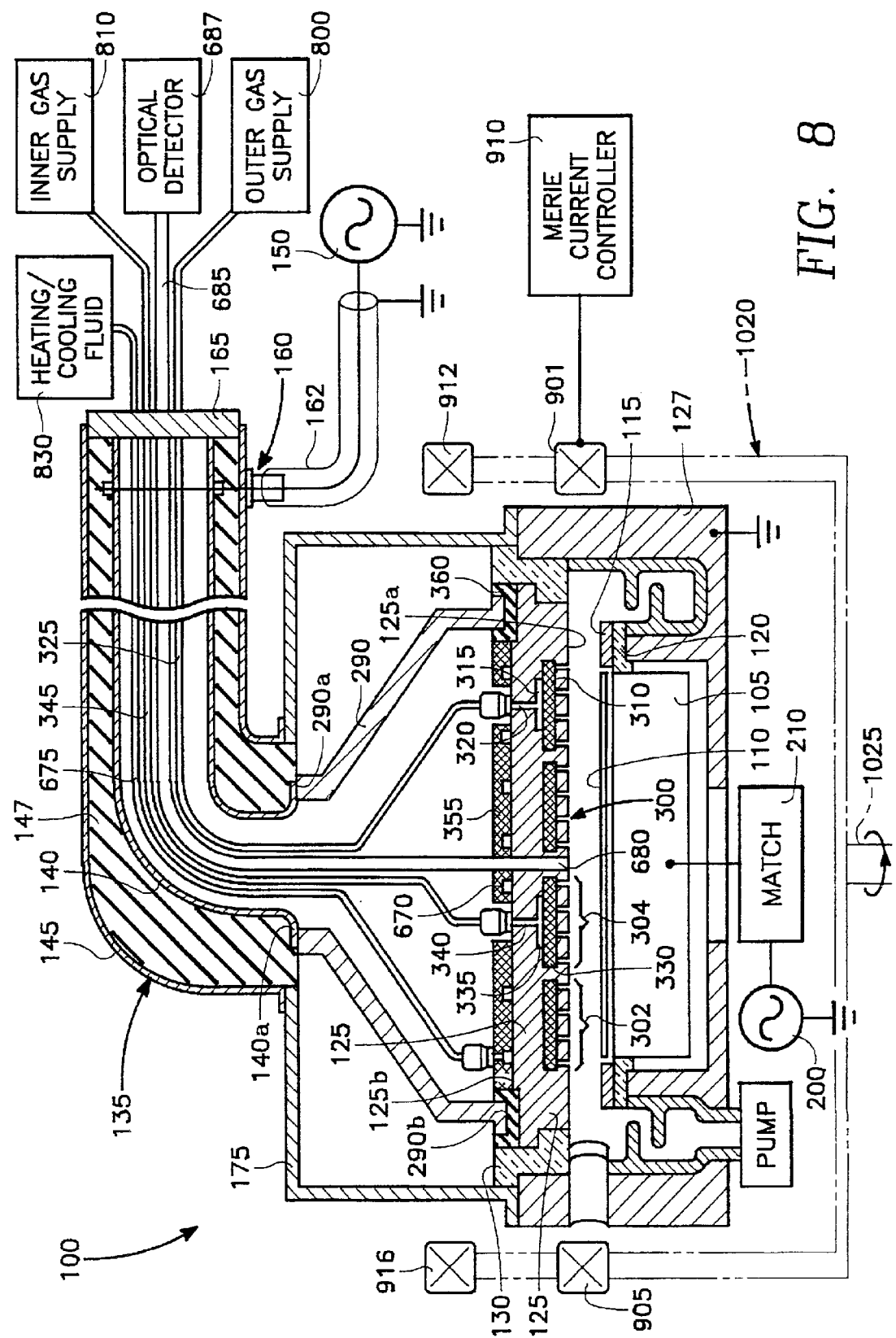
FIG. 8 depicts another embodiment of the present invention.
Figure 9:
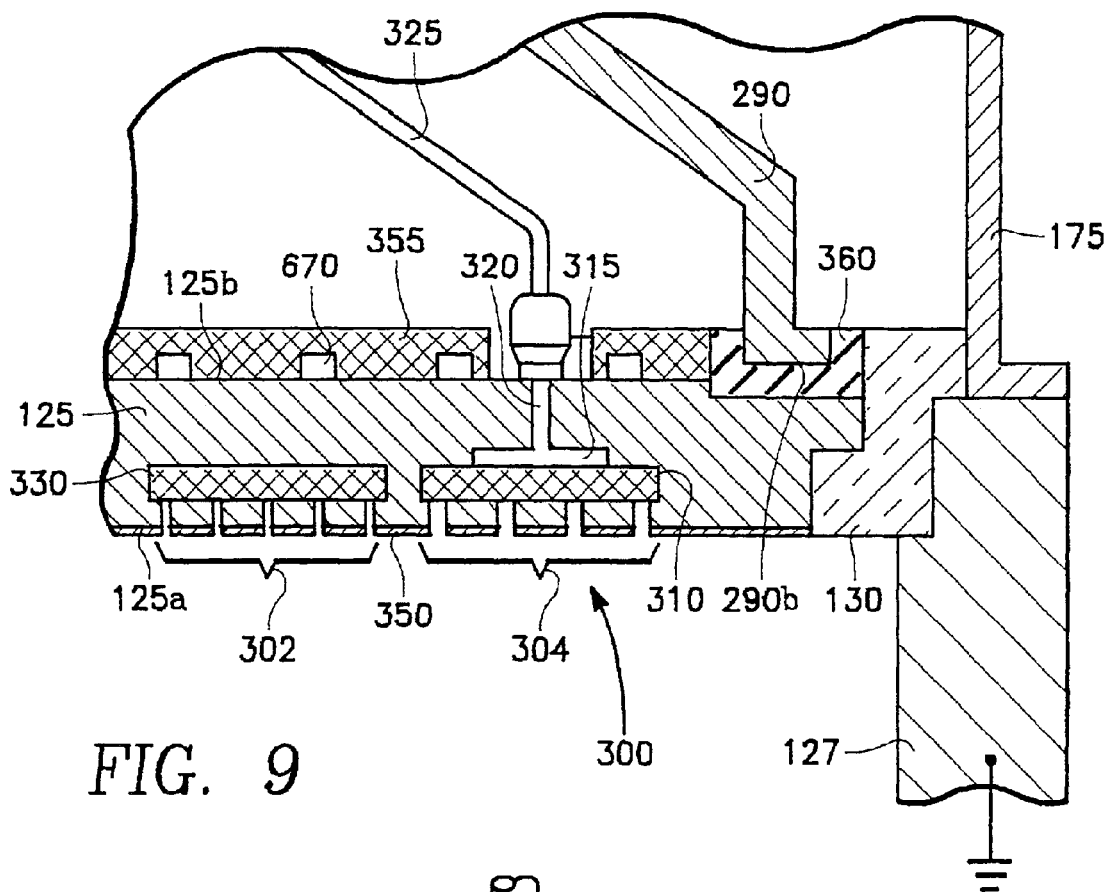
FIG. 9 is an enlarged view corresponding to FIG. 8.

Structure of the VHF Capacitively Coupled Reactor with MERIE Magnets:

Referring to FIGS. 8 and 9, a VHF capacitively coupled plasma reactor includes the following elements found in the reactor of FIG. 1: a reactor chamber 100 with a wafer support 105 at the bottom of the chamber supporting a semiconductor wafer 110. A process kit in the illustrated embodiment consists of a semi-conductive or conductive ring 115 supported by a dielectric ring 120 on the grounded chamber body 127. The chamber 100 is bounded at the top by a disc shaped overhead aluminum electrode 125 supported at a predetermined gap length above the wafer 110 on grounded chamber body 127 by a dielectric seal 130. The overhead electrode 125 also may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the coaxial cable 162/RF power generator 150, as will be more fully described below. The chamber body is connected to the RF return (RF ground) of the RF generator 150. The RF path from the overhead electrode 125 to RF ground is affected by the capacitance of the process kit dielectric ring 120 and the dielectric seal 130. The wafer support 105, the wafer 110 and the process kit semiconductive (or conductive) ring 115 provide the primary RF return path for RF power applied to the electrode 125.

The improvement in plasma density distribution uniformity is achieved by the introduction of a set of MERIE electromagnets 901, 903, 905, 907 spaced equally about the periphery of the wafer support pedestal and outside of the reactor chamber. These MERIE magnets are adapted to produce a magnetic field that slowly rotates about the axis of symmetry of the cylindrical chamber generally across the surface of the wafer support pedestal. In one embodiment this feature is realized by the MERIE magnets 901, 903, 905, 907 having electromagnet windings wound about respective axes tangent to the circumference of the wafer support pedestal. In this one embodiments, an MERIE current controller 910 controls the individual current to each MERIE magnet. A circulating magnetic field is generated in the plane of the workpiece support by the controller 910 providing individual AC currents to each of the individual magnet windings of the same frequency but offset in phase by 90 degrees (or by 360 degrees divided by the number of MERIE magnets). In an alternative embodiment, the feature of a rotating magnetic field is realized by a support frame 1020 (dashed line) supporting all of the MERIE magnets that is rotated about the axis of symmetry by a rotor 1025 (dashed line). In this alternative embodiment, the MERIE magnets are permanent magnets.

A second array of MERIE magnets 912, 914, 916, 918 equally spaced about the workpiece or wafer support pedestal but in a higher plane than the first set of MERIE magnets 901, 903, 905, 907 may be provided as well. Both sets of magnets lie in respective planes that are near the plane of the workpiece support.

The controller 910 applies a low frequency (0.5–10 Hz) AC current to each of the electromagnets 90–907, the phases of the currents applied to neighboring magnets being offset as described above by 90 degrees. The result is a magnetic field that rotates about the axis of symmetry of the workpiece support at the low frequency of the AC current. The magnetic field causes the plasma to be drawn toward the magnetic field near the workpiece surface and to circuculate with the field. This stirs the plasma so that its density distribution becomes more uniform. As a result, reactor performance is significantly improved because more uniform etch results are obtained across the entire surface of the wafer.

Introduction of Process Gas Through the Overhead Electrode:

As referred to previously herein, an MERIE reactor is best implemented by feeding the processes gas from the overhead ceiling. In the present invention, this requires feeding the process gases through the overhead electrode 125. For this purpose, the overhead electrode 125 in the embodiment of FIGS. 8 and 9 is a gas distribution showerhead, and therefore has a large number of gas injection ports or small holes 300 in its bottom surface 125a facing the workpiece support 105. In an exemplary embodiment, the ports 300 were between 0.01 and 0.03 inch in diameter and their centers are uniformly spaced apart by about ⅜ inch. In the embodiment illustrated in FIG. 8, the annular top 290a of a conical metal housing 290 supports the near end 140a of the coaxial stub inner conductor 140 and its annular base 290b rests on the aluminum overhead electrode 125. The conical shape of the housing 290 defines a large open plenum over the overhead electrode 125 within which various utilities may be fed from the hollow coaxial inner conductor 140 to the overhead electrode 125. As will be described in more detail below, the conical housing base 290b is near the outer circumference of the overhead electrode 125, leaving nearly all of the upper surface of the overhead electrode 125 accessible.

In this embodiment, the ports 300 consist of a radially outer group of 0.020 in diameter ports 302 and a radially inner group of 0.010 in diameter ports 304. The outer group of ports 302 may extends beyond the circumference of the wafer, in order to ensure uniform gas flow at the wafer periphery. One advantage of this feature is that the radial distribution of process gas flow can be adjusted in such a manner as to compensate for the tendency of the VHF capacitively coupled reactor of FIGS. 1–7 to produce a plasma density that is greater over the center of the wafer and less over the wafer periphery.

A radially outer aluminum foam layer 310 within the overhead electrode 125 overlies the ports 302. A radially outer gas distribution manifold or plenum 315 overlying the outer foam layer 310 is coupled through an axial gas passageway 320 to a gas supply line 325 passing through the interior conductor 140 of the coaxial tuning stub 135. A radially inner aluminum foam layer 330 within the overhead electrode 125 overlies the ports 304. A radially inner gas distribution manifold or plenum 335 overlying the inner foam layer 330 is coupled through an axial gas passageway 340 to a gas supply line 345 passing through the interior conductor 140 of the coaxial tuning stub 135. The aluminum foam layers 310 and 330 baffle the incoming process gases. The radial distribution of process gas flow rate is adjusted by independent selection of process gas flow rates within each one of the gas supply lines 325 and 345.

Figure 10:
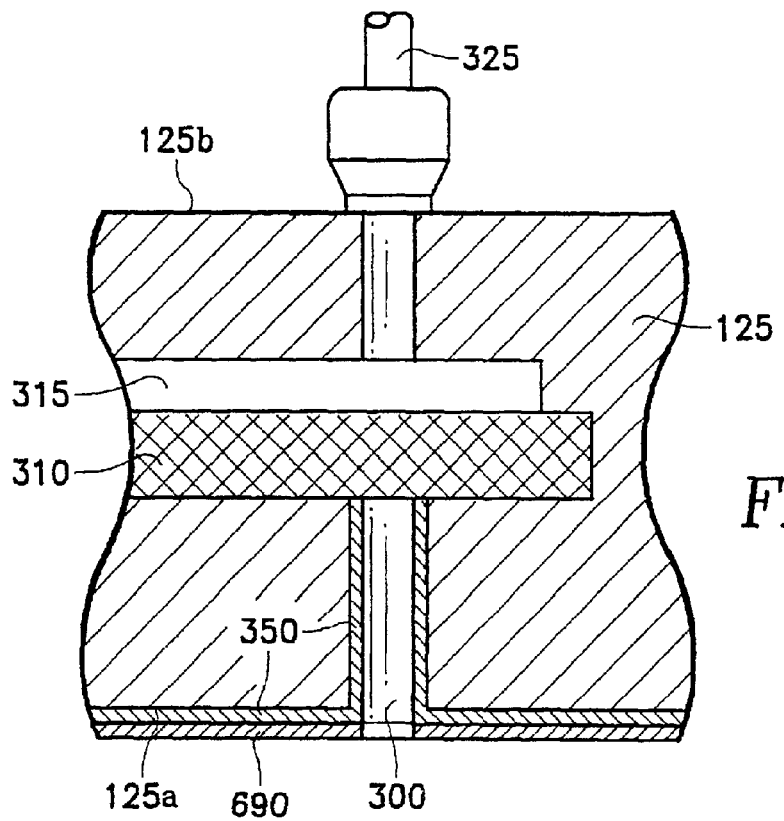
FIG. 10 is an enlarged view of FIG. 9.

Suppression of Arcing in the Gas Injection Ports:

In order to provide some capacitance between the plasma and the overhead electrode as a means of reducing arcing, the overhead electrode bottom surface 125a is coated with a dielectric layer. For example, the overhead electrode 125 is aluminum and the dielectric coating is formed by anodizing the electrode bottom surface 125a. Such anodization forms a very thin dielectric coating not only on the flat bottom surface 125a but also on the interior surfaces of the gas injection ports 300. This feature tends to suppress arcing within the gas injection ports by providing a charge storage capability that can compensate for RF plasma currents flowing to the overhead electrode 125. FIG. 10 is an enlarged partial view corresponding to FIG. 8 illustrating the resulting fine structure near one of the gas inlet ports 300. In particular, an aluminum oxide layer 350 formed by anodization covers the electrode bottom surface 125a and covers the interior surface of the gas injection port 300.

In order to suppress electric fields near the overhead electrode 125, the top surface 125b of the overhead electrode 125 is covered with a relatively thick (0.25 in) layer of aluminum foam 355. The thick aluminum foam 355 tends to keep the electric potential near the overhead electrode constant in the axial (vertical) direction, thereby suppressing electric fields in that vicinity which would otherwise contribute to plasma arcing within the gas injection ports 300.

In order to block D.C. plasma currents from flowing through the overhead electrode to the coaxial stub center conductor 140, a thin insulative layer 360 is placed between the overhead electrode 125 and the base 290b of the conductive housing 290 that connects the overhead electrode 125 to the coaxial center conductor 140. This feature allows the D.C. potential of the overhead electrode to float. A capacitor is thereby formed between the overhead electrode 125 and the conductive housing base 290b. The capacitance of this capacitor is determined by the area of the base 290b as well as by the thickness and dielectric constant of the thin insulative layer 360. Preferably, the capacitance of this capacitor is selected to provide a narrow resonance or low impedance path at a particular HF frequency, while providing an RF short across the entire VHF band. In this way, the overhead electrode 125 provides a return path for HF bias power applied to the wafer support pedestal 105, but does not affect the behavior of the overhead electrode 125 at the VHF source power frequency. By thus, blocking D.C. plasma current that would otherwise flow to the overhead electrode, plasma arcing within the gas injection ports 300 is suppressed because such D.C. currents would contribute to arcing.

In summary, plasma arcing within the gas injection ports 300 is suppressed by one or more of the following features: (a) forming a dielectric coating 350 on the bottom of the overhead electrode 125 and on the interior surfaces of the gas injection ports 300, (b) providing a metallic aluminum foam layer 355 on top of the overhead electrode 125, and (c) placing a thin insulative layer 360 between the overhead electrode 125 and the conductive housing 290.

Suppression of Plasma Sheath-Generated Harmonics:

The thin insulative layer 360 plays a role in suppressing plasma sheath-generated harmonics of the HF bias signal applied to the wafer support pedestal 105. The presence of such harmonics degrades process performance, and specifically reduces etch rates. By selecting the capacitance-determining characteristics of the insulative layer 360 (i.e., dielectric constant and thickness), the return path from the plasma through the overhead electrode 125 and coaxial inner conductor 140 is tuned to resonate (and therefore have a very high admittance) at a particular HF frequency. While one choice for this resonant frequency would be the fundamental of the HF bias signal applied to the wafer support pedestal 105, it is a discovery of the invention that the etch rate is improved by 10% to 15% by selecting this resonance to be the second harmonic of the bias signal. Such a favorable result is achieved because harmonics generated by the non-linear load presented by the plasma sheath are quickly returned to ground through the low impedance path presented by the overhead electrode and coaxial center conductor 140 by virtue of the capacitive layer 360.

Selection of the thickness of the capacitor layer 360 to tune the return path through the overhead electrode 125 to a particular HF frequency is affected by a number of factors, including the capacitance of the thin plasma sheath at the overhead electrode 125, the capacitance of the thick plasma sheath at the wafer support pedestal 105 as well as the capacitance of the plasma itself. Numerous conventional techniques may be readily employed by the skilled worker to find the correct thickness of the capacitor layer 360 to achieve resonance at the selected HF frequency given the particular plasma operating conditions, including trial and error.

Electrode Surface Temperature Control:

In an oxide etch reactor, polymer deposits are a serious problem because the process gas must be able to form polymer layers over non-oxide containing surfaces on the workpiece in order to achieve a suitable etch selectivity between silicon dioxide materials and other materials that are not to be etched. During plasma processing using flourocarbon gases, the simpler fluorine ions and radicals perform the etching while the carbon-rich species deposit polymer over all non-oxygen-containing materials on the workpiece as well as all interior surfaces of the reactor chamber. In order to avoid contamination of the workpiece by polymer particles falling from chamber interior surfaces into the plasma, these surfaces must be kept at a sufficiently low temperature and the plasma electron energy must be kept sufficiently low to avoid tearing such deposits off of the chamber interior surfaces. Alternatively, the chamber vacuum must be interrupted and a chemical cleaning step performed to remove such deposits, a step that greatly reduces productivity of the reactor.

The capacitively coupled VHF source described with reference to FIG. 1 is highly efficient and therefore capable of producing, during a non-chemical cleaning step, a sufficiently high plasma density to thoroughly remove from the chamber interior surfaces any polymer residue deposited during wafer processing. During such a cleaning step, the usual plasma process gases may be replaced by a more volatile gas (e.g., one tending to produce a plasma with a very high free fluorine content). Since no liquid chemicals need be introduced into the chamber, the chamber remains closed so that the cleaning step may be performed quickly and frequently to keep the chamber free of polymer deposits. Therefore, an operating mode of the reactor of FIG. 8 is one in which the chamber surface temperatures and the plasma ion energies are sufficiently great to avoid accumulation of polymer on the interior chamber surfaces.

For this purpose, the reactor of FIG. 8 includes passages 670 (for heat-conducting fluid) on the overhead electrode 125. In the implementation of FIG. 8, the fluid passages 670 are formed between the upper aluminum foam layer 355 and the upper surface of the overhead electrode 125. Alternatively, such passages may be formed completely internally within the overhead electrode 125. A temperature-controlling fluid or gas is fed to the fluid passages 670 from a fluid supply line 675 passing through the hollow inner coaxial conductor 140. Thus, the temperature of the overhead electrode 125 may be precisely controlled. By thus controlling the electrode temperature and by controlling other plasma process parameters such plasma ion energy, the reactor may be operated in either deposition mode (in which the surfaces are sufficiently cool to accumulate polymer) or in a depletion mode (in which the surfaces are sufficiently hot to allow plasma ions to tear away polymer from the surfaces and thereby avoid accumulation of polymer). The depletion mode is effective because this mode better avoids particle contamination.

Optical Monitoring of the Plasma Process:

Since the reactor of FIG. 8 can be operated so as to be free of polymer deposits on the chamber interior surfaces, an optical window 680 may be provided in the bottom surface of the overhead electrode 125. An optical channel such as an optical fiber or light pipe 685 is connected at one end to the optical window 680 and passes through the hollow inner coaxial conductor 140. The light pipe 685 is connected to a convention optical detector 687 at the outer end.

With this feature, end point detection and other measurements may be performed using such an optical detector. Specifically, the detector 687 measures the thickness of a selected layer on the workpiece or semiconductor wafer 110, using well-known optical techniques. During an etch process, for example, the process would be halted after the thickness of the material being etched is reduced to a predeterminded thickness, as measured by the detector 687.

Prevention of Contamination:

Since the chamber interior surfaces can be maintained free of polymer deposits, they remain exposed to the plasma. In particular, the bottom surface of the aluminum overhead electrode 125 is continually subject to attack from the plasma, and is therefore liable to contribute aluminum species into the plasma, leading to contamination of the workpiece and hence process failure. In order to prevent such a problem, the bottom surface of the overhead electrode 125, which may be anodized, is coated with a process-compatible material such as silicon or silicon carbide. Thus, as shown in FIGS. 10 and 11A, a thin silicon carbide film 690 covers the bottom anodized surface of the aluminum overhead electrode 125. The thin silicon or silicon carbide film 690 prevents the plasma from attacking the aluminum material of the electrode 125. To the extend the plasma removes material from the silicon-containing film 690, the species thus introduced into the plasma cannot contaminate the process because such species (silicon and carbon) are already present in the plasma and/or workpiece and therefore are compatible with the process. Silicon is present in the plasma where silicon oxide is being etched. Carbon is in the plasma wherein fluoro-carbon gases are employed as process etch gases.

In an alternative embodiment, the overhead electrode is not anodized and the silicon carbide film 690 is formed over a pure aluminum surface of the electrode 125. In another alternative embodiment illustrated in FIG. 11B, the gas injection holes 300 are L-shaped (involving two right-angle turns) and their openings into the chamber are annular, the annular opening of each hole 300 being defined by a solid disk 300a blocking the center of each opening.

Results:

The invention thus provides a plasma reactor which is far less sensitive to changes in operating conditions and/or variations in manufacturing tolerances. It is believed that these great advantages including lack of sensitivity to operating conditions—i.e., broad tuning or frequency space for impedance matching—are the contributions of at least one or more of a number of reactor features. These features include an overhead reactor electrode having a capacitance matching or nearly matching the magnitude of the negative capacitance of the plasma at the most desired processing plasma ion densities, use of a VHF source power frequency matching or nearly matching the plasma-electrode resonance frequency; the close relationship of the VHF source power frequency, the plasma-electrode resonance frequency and the stub resonance frequency; offsetting the plasma-electrode resonance frequency, the stub resonance frequency and the source power frequency from one another; and the use of a resonant stub match to couple source power to the overhead electrode, preferably with the source power input tap 160 offset slightly from the ideal match location.

It is believed that offsetting the plasma, stub and source power frequencies broadens the tuning space of the system by, in effect, de-tuning the system. Using a stub match broadens the tuning space by matching across a broader frequency range. Offsetting the stub tap point 160 from the ideal match point further optimizes the system to broaden the tuning space, because this feature has the effect of adding current when delivered power would otherwise decline and of subtracting current when delivered power would otherwise increase. Using a higher (VHF) source power frequency provides a decrease in system Q or an increase in tuning space proportional to the increase in source power frequency. More importantly, this selection allows the electrode-plasma resonance to be matched to the source power frequency at a plasma density favorable to etch processes.

Because the invention renders the reactor virtually immune to changes in process conditions over a broader process window, it provides the three-fold advantage of a reactor that is (a) workable over a wider range of process condition deviations, (b) useful over a broader range of applications (different process recipes) and (c) whose performance is virtually unaffected over a wider range of manufacturing tolerances, so that reactor-to-reactor characteristics are uniform.

Consequently, superior results have been attained. Specifically, the Q of the system has been minimized to about 5 in some cases to retain a superior degree of uniformity of characteristics and performance among different reactors of the same model, and to enhance process window. High plasma densities on the order of $10^{12}$ ions/cc have been achieved consistently with only 2 kW of source power. The system sustained plasmas over a pressure range of 10 mT to 200 mT with no transitions with source power levels as low as 10 W. The shorted impedance matching coaxial stub resonating near the VHF plasma and source power frequencies shorted out parasitic VHF plasma sheath harmonics while realizing a power efficiency in excess of 95%. The system accommodated plasma resistive load variations of 60:1 and reactive load variations of 1.3 to 0.75 while maintaining the source power SWR at less than 3:1.

It is believed that this increased capability to accommodate load variations, and hence expanded process windows, is due in large part to (a) the matching of the electrode and plasma capacitances under the design operating conditions, accomplished as above described by appropriate choice of dielectric values between the electrode 125 and its conductive support as well as the appropriate choice of VHF source power frequency; and (b) the specially configured coaxial stub with the optimal tap positioning, by which the tap current added to the stub current under low load conditions and subtracted from it under high load conditions. It is believed the very high power efficiency is due in large part to the impedance transformation provided by the coaxial stub, which minimizes reflection losses both at the generator connection as well as at the electrode connection, due to obtaining a match between stub resonant frequency and electrode-plasma resonant frequency, along with optimal tap positioning for realizing a low current and high voltage in the coaxial stub where resistive losses dominate and a high current low voltage at the electrode/plasma where capacitive losses dominate. Yet all these benefits are provided while avoiding or minimizing the need for conventional impedance match apparatus.

While exemplary embodiments of the invention adapted for dielectric and conductor etching have been described in detail, the reactor is also advantageous for choices of plasma operating conditions other than those described above, including different ion densities, different plasma source power levels, different chamber pressures. These variations will produce different plasma capacitances, requiring different electrode capacitances and different electrode-plasma resonant frequencies and therefore require different plasma source power frequencies and stub resonant frequencies from those described above. Also, different wafer diameters and different plasma processes such as chemical vapor deposition may well have different operating regimes for source power and chamber pressure. Yet it is believed that under these various applications, the reactor will generally enhance the process window and stability as in the embodiment described above.

Figure 12:
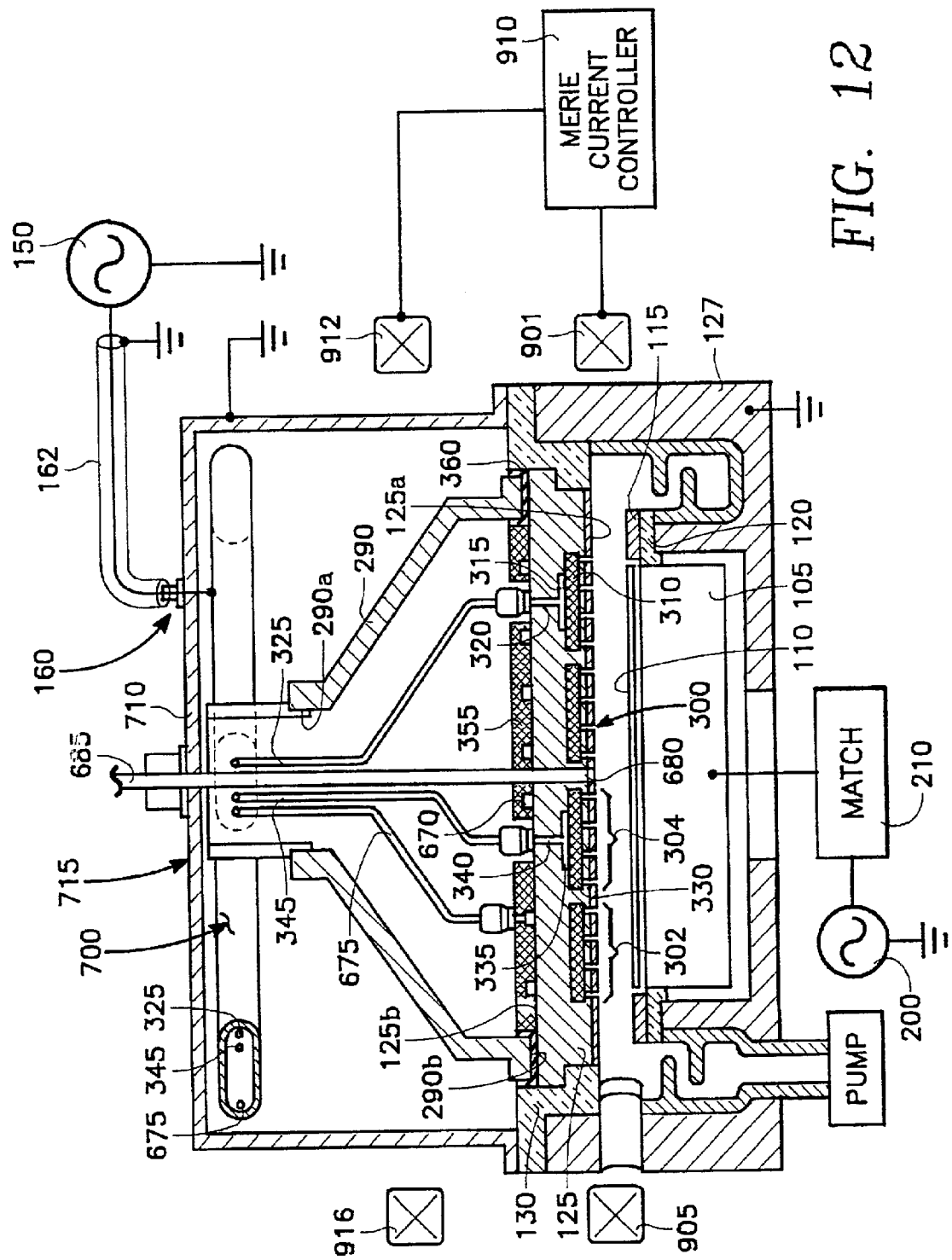
FIG. 12 depicts yet another embodiment of the present invention.
Figure 13:
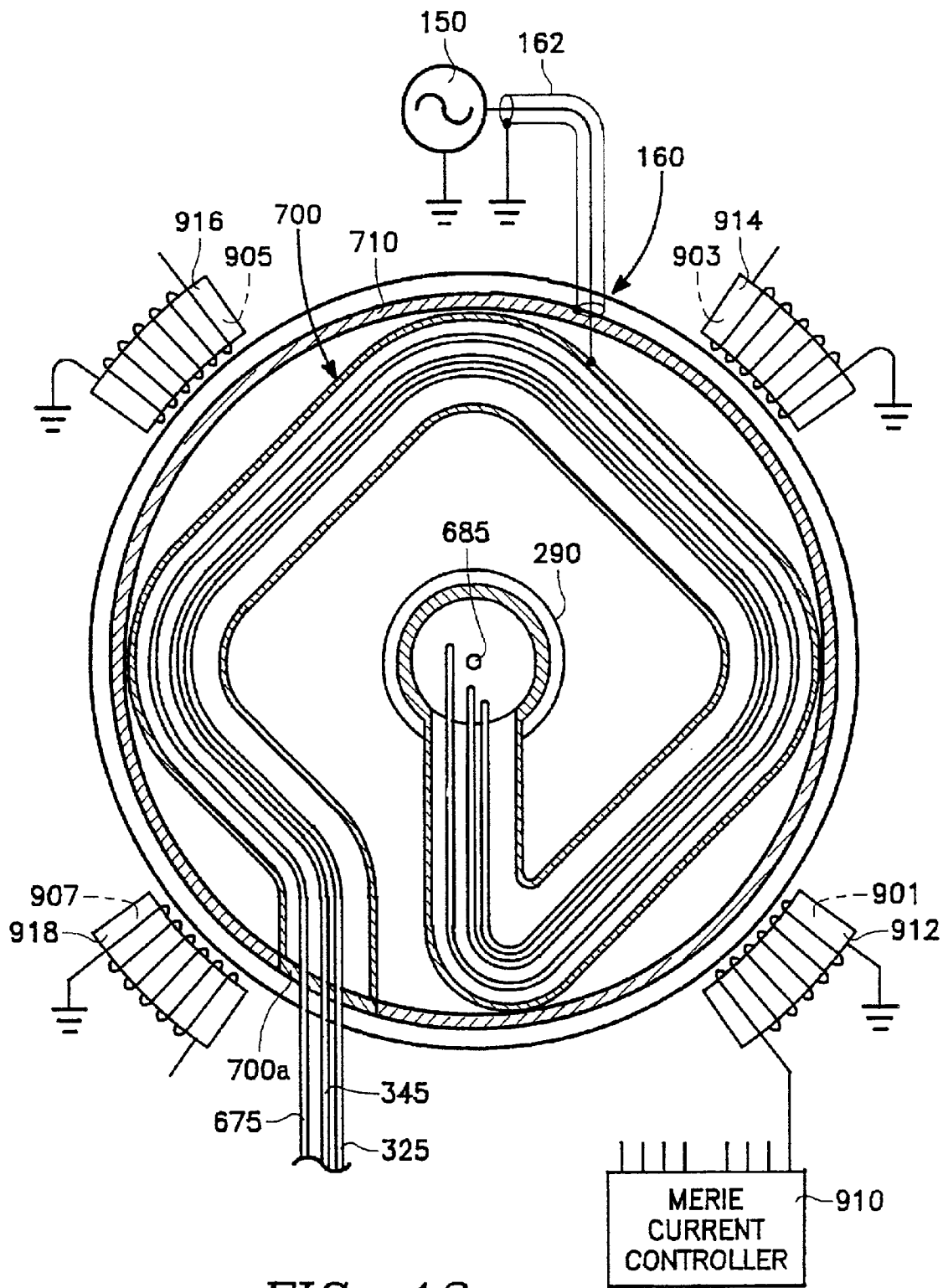
FIG. 13 is a top view corresponding to FIG. 12.
Figure 14:
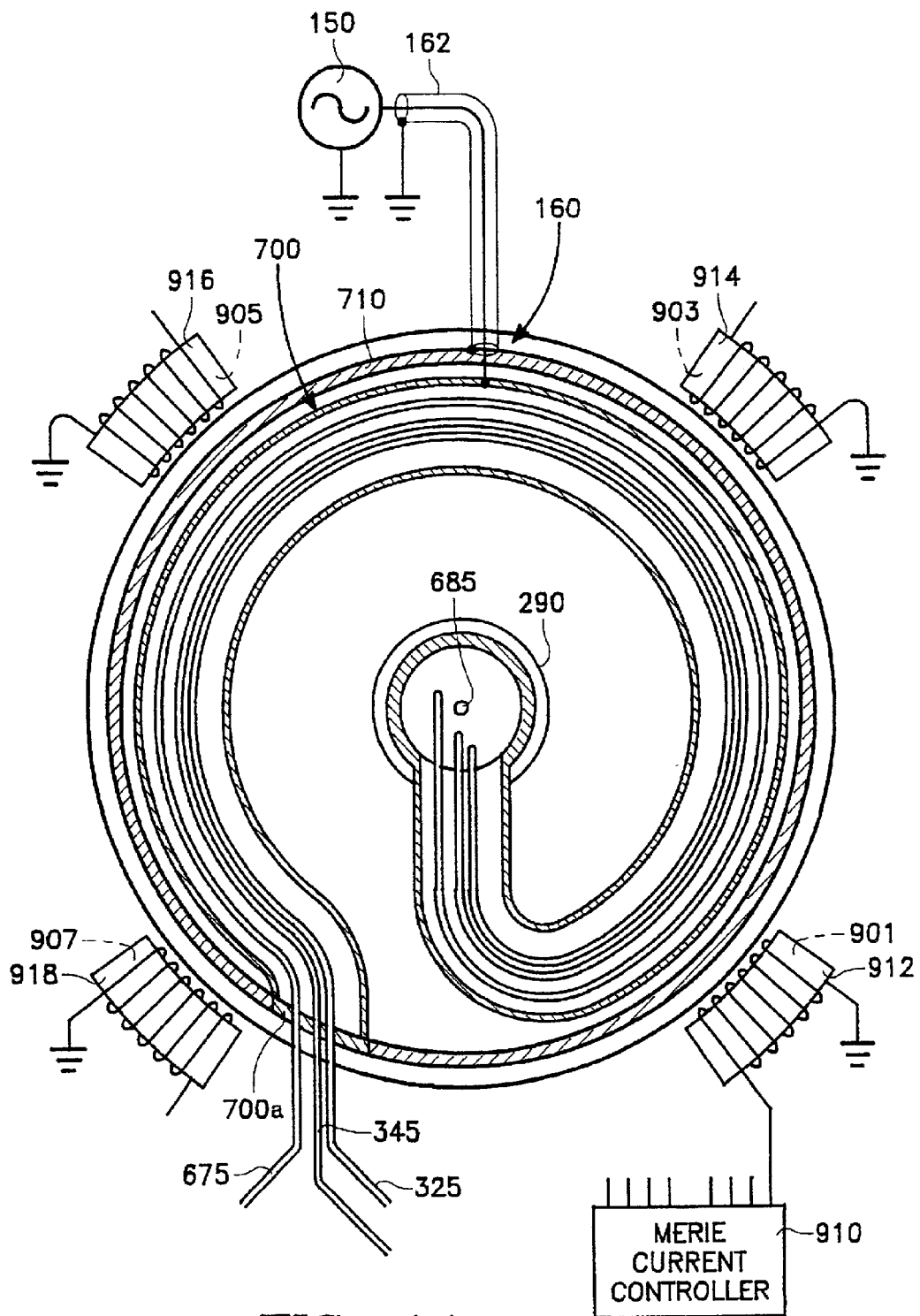
FIG. 14 is a top view corresponding to an alternate embodiment of the reactor of FIG. 13.

Compact VHF Fixed Tuning Element:

The coaxial tuning stub of FIGS. 1 and 8 is a tuning element that provides an impedance match over a large tuning space, as described with reference to FIGS. 1–7. However, because of its elongate linear design, its footprint is actually larger than that of the plasma reactor chamber. In those situations where this aspect is found to be inconvenient, the coaxial tuning stub of FIGS. 1 and 8 is replaced by an equivalent strip line circuit, as illustrated in FIGS. 12, 13 and 14. The center conductor of the VHF generator 50 Ohm coaxial output connector is connected to a strip line conductor 700, while the outer conductor of the VHF generator 50 Ohm coaxial output connector is connected to the metal ceiling 710 of a housing 715 covering the top of the reactor. The conductive ceiling 710 functions as a ground plane that the strip line conductor 700 faces. The strip line conductor 700 is generally oval in cross-section, with its broader side facing the ground plane ceiling 710. The characteristic impedance of the strip line conductor is determined by its spacing from the ground plane ceiling 710. Preferably, the strip line conductor 700 is uniformly spaced from the ground plane ceiling 710 along its entire length.

In an exemplary embodiment, the strip line conductor was 0.125 inch in height, 2.5 inches wide and is displaced below the ground plane ceiling 710 by 0.5 inch. By having the wider (2.5 inch) side of the strip line conductor 700 facing the ground plane ceiling 710, current flow is more distributed across the entire 2.5 inch width of the strip line conductor 700, thereby reducing resistive losses in the outer surface where most of the current flow occurs. The length of the strip line conductor 700 is determined in the same manner as the length of the coaxial tuning stub 135, as described above in detail with reference to FIG. 1. Furthermore, the placement of the RF tap 160 along the length of the strip line conductor 700 is also determined in the same manner as the placement of the RF tap along the length of the coaxial stub 135, as described with reference to FIG. 1. Finally, the end of the strip line conductor 700 of FIG. 12 furthest from the overhead electrode 125 is, like the corresponding end of the coax stub inner conductor 140 of FIG. 1, shorted to ground. In the case of the strip line conductor 700, the short to ground is achieved by a connection at the far end 700*a* to the ground plane ceiling 710, as shown in FIG. 13.

Like the coaxial tuning stub 135 of FIGS. 1–8, the strip line conductor 700 has a length equal to a quarter wavelength of the resonant frequency of the fixed tuning element, in this case the strip line circuit comprising the strip line conductor 700 and the ground plane ceiling. Therefore, the selection of the length of the strip line conductor 700 is exactly as the selection of the length of the coaxial tuning stub 135 which is described above with reference to FIGS. 1–7. In one embodiment, this length was about 29 inches.

The RF tap 160 of FIG. 12 connects the VHF generator to the strip line circuit at a particular point along the length of the strip line conductor 700, just as the RF tap 160 of FIG. 1 makes the corresponding connection along the length of the coaxial tuning stub 135. In the case of FIG. 12, the center conductor of the VHF generator output coaxial connector is connected at the tap 160 to the strip line conductor while the outer conductor of the VHF generator output coaxial conductor is connected to the ground plane ceiling at the point overlying the tap connection to the strip line conductor.

The location of the tap point 160 in FIG. 12 along the length of the strip line conductor 700 is determined in the same manner as the location of the tap in FIG. 1 along the length of the coaxial stub, as described above in detail with respect to FIG. 1. With this feature, the strip line circuit comprising the strip line conductor 700 and the ground plane ceiling performs in the same manner as the coaxial tuning stub 135 of FIG. 1, including the feature described with respect to FIG. 1 in which the impedance match space can accommodate as much as a 100:1 variation in load resistance by slightly offsetting the tap point 160 from a theoretical optimum. As described above with reference to FIG. 1, the theoretical optimum location of the tap 160 is at a point along the length of the tuning stub 135 (or, equivalently, along the length of the strip line conductor 700 of FIG. 12) at which the ratio between the standing wave voltage and current equals the output impedance of the VHF generator or the characteristic impedance of the coaxial cable connected therebetween. The discovery described with reference to FIG. 1 is that the impedance match space is surprisingly expanded by offsetting the tap 160 by about 5% from the theoretical optimum location. Thus, the strip line conductor circuit of FIG. 12 provides all the advantages and functions of the coaxial tuning stub of FIG. 1 but further adds the advantage of compactness.

Like the inner conductor 140 of the coaxial stub of FIG. 8, the strip line conductor 700 of FIG. 12 is hollow in order to accommodate the utility lines connected to the electrode 125, and is connected to the top surface 290a of the conical housing 290. The advantage of the strip line conductor 700 (over the coaxial tuning stub of FIGS. 1 and 8) is that the strip line conductor 700 can extend in a circular fashion within the housing 715 so that its requisite length can be realized without extending beyond the "footprint" of the reactor chamber.

The length of the strip line conductor is determined in the same manner that the length of the coaxial tuning stub is determined, as described above with reference to FIG. 1. The impedance of the strip line conductor 700 is determined by adjusting its displacement from the ground plane ceiling 710. As described above, this impedance is best selected to be about 30 Ohms, or less than the VHF generator output impedance. The location of the tap 160 from the VHF generator 150 along the length of the strip line conductor 700 is made in the same manner as the location of the RF tap 160 on the coaxial tuning stub as described above with reference to FIG. 1. The strip line conductor 700 in combination with the ground plane ceiling 710 performs the same function as the coaxial tuning stub of FIG. 1 or 8, and provides the same performance advantages as described above with reference to FIG. 1.

While the top view of FIG. 13 shows an embodiment in which the strip line conductor 700 is wound along a nearly square path (with rounded corners), FIG. 14 illustrates another embodiment in which the strip line conductor 700 is circularly wound.

Utilities Fed Through the Tuning Element:

As described above with respect to FIGS. 8 and 12, the coaxial stub inner conductor 140 of FIG. 8 and the strip line conductor 700 of FIG. 12 are both hollow in order to accommodate lines that carry various utilities to the overhead electrode. Thus, as illustrated in both FIGS. 8 and 12, the outer gas supply line 325 is connected to an outer gas flow controller 800, the inner gas supply line 345 is connected to an inner gas flow controller 810, the optical fiber or light pipe 685 is connected to the optical detector 687, and the heating/cooling line 675 is connected to a heating/cooling source controller 830.

The fixed tuning element 135 is either a coaxial tuning stub (as in the embodiments of FIGS. 1 and 8) or a strip line circuit (as in the embodiments of FIGS. 12 and 14). Antenna designers will recognize the equivalent function performed by both embodiments of the fixed tuning element in providing an impedance match between the characteristic output impedance of the RF generator and the impedance of the electrode/plasma combination. Both embodiments of the fixed tuning element (or, equivalently, fixed impedance match element) share structural feature in common, including the use of a center conductor (either a strip line conductor in FIG. 12 or an inner coaxial conductor in FIG. 8) and a grounded conductor (the ground plane ceiling of FIG. 21 or the grounded outer coaxial conductor of FIG. 8). In both cases, the characteristic impedance of the impedance match element is determined by the spacing between the two conductors, while the input impedance to the impedance match element is determined by the location along the center conductor of the connection to the RF generator. Also, the center conductor is hollow and therefore serves as an RF-shielded conduit for gas feed lines and heat-conductive fluid feed lines. And the most important common feature is that both embodiments of the impedance match element are physically fixed in structure, and therefore require no moving parts or intelligent controllers, a significant advantage. Other related advantages have already been described. The fixed impedance match element of both embodiments may therefore be referred to in general as a fixed two-conductor impedance match element with a hollow center conductor.

While the invention has been described in detail by reference to various embodiments, it is understood that variations and modifications thereof may be made without departing from the true spirit and scope of the invention.

What is claimed is:

1. A plasma reactor for processing a semiconductor workpiece, comprising:

a reactor chamber having a chamber wall and containing a workpiece support for holding the semiconductor workpiece;

an overhead electrode overlying said workpiece support;

an RF power generator for supplying power at a frequency of said generator;

said overhead electrode having a reactance that forms a resonance with the plasma at an electrode-plasma resonant frequency which is at or near said frequency of said generator;

a magnetic field generator for producing a controllable magnetic field over the surface of said workpiece; and a fixed impedance matching element coupled to said RF power generator and to said overhead electrode.

2. The reactor of claim 1 wherein said magnetic field is sufficiently small in magnitude so that the electron cyclotron frequency associated with said magnetic field is less than the frequency of said RF power generator.

3. The reactor of claim 2 wherein said electron cyclotron frequency is at least 5% less than said RF power generator frequency.

4. The reactor of claim 2 wherein said frequency of said RF power generator is a VHF frequency.

5. The reactor of claim 1 further comprising:
an insulating layer formed on a surface of said overhead electrode facing said workpiece support.

6. The reactor of claim 5 further comprising:
a capacitive insulating layer between said RF power generator and said overhead electrode.

7. The reactor of claim 6 further comprising:
a metal foam layer overlying and contacting a surface of said overhead electrode that faces away from said workpiece support.

8. The reactor of claim 5 further comprising a silicon-containing coating covering said insulating layer.

9. The reactor of claim 8 wherein said silicon-containing coating comprises one of silicon or silicon carbide.

10. The reactor of claim 7 wherein said insulating layer provides a capacitance sufficient to suppress arcing within said gas injection ports.

11. The reactor of claim 10 wherein said capacitive insulating layer has a sufficient capacitance to block D.C. current from a plasma within said chamber from flowing through said overhead electrode.

12. The reactor of claim 11 wherein:
said electrode has plural gas injection orifices therein generally facing said workpiece support; and
said metal foam layer is of a sufficient thickness to suppress an axial electric field within said gas injection orifices.

13. The reactor of claim 5 wherein said overhead electrode comprises aluminum and said insulating layer is formed by anodization.

14. The reactor of claim 6 wherein said capacitive insulating layer forms a capacitance that provides a low impedance path to ground through said overhead electrode for plasma sheath generated harmonics.

15. The reactor of claim 6 further comprising:
a gas inlet to said overhead electrode;
a gas baffling layer within said overhead electrode between said gas inlet and at least a first set of said gas injection orifices.

16. The reactor of claim 15 wherein said gas baffling layer comprises a layer of metal foam.

17. The reactor of claim 13 further comprising thermal control fluid passages within said overhead electrode.

18. The reactor of claim 17 further comprising an optical window in said overhead electrode generally facing said wafer support and a light carrying medium coupled to said window and extending through said overhead electrode.

19. The reactor of claim 5 wherein said plasma has a reactance and the reactance of said electrode corresponds to the reactance of said plasma.

20. The reactor of claim 19 wherein the reactance of said electrode is a conjugate of the reactance of said plasma.

21. The reactor of claim 19 wherein the reactance of said plasma comprises a negative capacitance, and wherein the capacitance of said electrode is the same magnitude as the magnitude of said negative capacitance of said plasma.

22. The reactor of claim 1 wherein the frequency of said RF generator and the electrode-plasma resonant frequency are VHF frequencies.

23. The reactor of claim 22 wherein said plasma reactance is a function of said plasma ion density and said plasma ion density supports a selected plasma process of said reactor.

24. The reactor of claim 23 wherein said plasma process is a plasma etch process and wherein said plasma ion density lies in a range from about $10^9$ ions/cubic centimeter to about $10^{12}$ ions/cubic centimeter.

25. The reactor of claim 1 wherein said fixed impedance match element has a match element resonant frequency.

26. The reactor of claim 25 wherein the match element resonant frequency and said electrode-plasma resonant frequency are offset from one another and the frequency of said generator lies between said electrode-plasma resonant frequency and said match element resonant frequency.

27. The reactor of claim 26 wherein said frequency of said generator, said plasma frequency and said match element resonant frequency are all VHF frequencies.

28. The reactor of claim 25 wherein said fixed impedance match element comprises:
a strip line circuit having a near end thereof adjacent said overhead electrode for coupling power from said RF power generator to said overhead electrode and providing an impedance transformation therebetween, said strip line circuit comprising:
a strip line conductor generally above said overhead electrode and connected at a near end thereof to said overhead electrode,
a ground plane conductor above said overhead electrode and spaced from said inner conductor along the length thereof and connected to an RF return potential of said RF power generator,
a tap at a selected location along the length of said strip line conductor, said tap comprising a connection between said strip line conductor and an output terminal of said RF power generator.

29. The reactor of 28 wherein said ground plane conductor comprises a ceiling of a housing overlying said overhead electrode, said strip line conductor formed along a winding path within said housing and beneath said ceiling.

30. The reactor of claim 29 wherein said strip line conductor is hollow, said reactor further comprising:
a gas feed line extending through said hollow strip line conductor for supplying process gas to said gas injection orifices in said overhead electrode.

31. The reactor of claim 1 wherein said VHF frequency is suitable for capacitively coupling plasma source power.

* * * * *